(12) United States Patent
Jung et al.

(10) Patent No.: US 9,852,796 B2
(45) Date of Patent: Dec. 26, 2017

(54) NONVOLATILE MEMORY DEVICES AND METHODS OF OPERATING THE SAME

(71) Applicants: Kee-Ho Jung, Suwon-si (KR); Sang-Hyun Joo, Suwon-si (KR)

(72) Inventors: Kee-Ho Jung, Suwon-si (KR); Sang-Hyun Joo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/263,773

(22) Filed: Sep. 13, 2016

(65) Prior Publication Data
US 2017/0140828 A1     May 18, 2017

(30) Foreign Application Priority Data
Nov. 12, 2015     (KR) ........................ 10-2015-0159225

(51) Int. Cl.
| G11C 16/04 | (2006.01) |
| G11C 16/16 | (2006.01) |
| G11C 16/08 | (2006.01) |
| G11C 16/24 | (2006.01) |
| G11C 16/26 | (2006.01) |
| G11C 16/34 | (2006.01) |
| G11C 29/50 | (2006.01) |
| G11C 29/02 | (2006.01) |
| G11C 29/04 | (2006.01) |

(52) U.S. Cl.
CPC ............ *G11C 16/16* (2013.01); *G11C 16/08* (2013.01); *G11C 16/24* (2013.01); *G11C 16/26* (2013.01); *G11C 16/3445* (2013.01); *G11C 29/025* (2013.01); *G11C 29/028* (2013.01); *G11C 29/50* (2013.01); *G11C 29/50004* (2013.01); *G11C 2029/0409* (2013.01); *G11C 2029/5004* (2013.01)

(58) Field of Classification Search
CPC .......... G11C 16/04; G11C 16/16; G11C 16/08
USPC ................................................. 365/185.11
See application file for complete search history.

(56) References Cited

U.S. PATENT DOCUMENTS

| 7,272,050 | B2 | 9/2007 | Han et al. |
| 7,606,100 | B2 | 10/2009 | Hemink et al. |
| 7,679,133 | B2 | 3/2010 | Son et al. |
| 7,733,706 | B2 | 6/2010 | Wang |
| 8,363,479 | B2 | 1/2013 | Honma |

(Continued)

*Primary Examiner* — Harry W Byrne
(74) *Attorney, Agent, or Firm* — Harness, Dickey, & Pierce, P.L.C.

(57) ABSTRACT

A nonvolatile memory device includes memory blocks that each include cell strings formed vertically on a substrate. The cell strings are coupled to a plurality of bit-lines. The cell strings each include memory cells connected to a string selection transistor. A method of operating the nonvolatile memory device includes performing an erase operation on a first memory block of the memory blocks in response to an erase command, performing an erase verification operation on the memory cells of the first memory block, performing a first sensing operation on the string selection transistors of each of the cell strings coupled to at least some bit-lines of the first memory block, and determining whether the first memory block is a fail block at least based on a result of the first sensing operation. The first sensing operation is based on a first sensing scheme selected among a plurality of sensing schemes.

20 Claims, 27 Drawing Sheets

(56) References Cited

U.S. PATENT DOCUMENTS

| | | |
|---|---|---|
| 8,514,624 B2 | 8/2013 | Parat et al. |
| 8,553,466 B2 | 10/2013 | Han et al. |
| 8,559,235 B2 | 10/2013 | Yoon et al. |
| 8,599,622 B2 | 12/2013 | Kim et al. |
| 8,654,587 B2 | 2/2014 | Yoon et al. |
| 8,982,629 B2 | 3/2015 | Dutta et al. |
| 8,982,642 B2 | 3/2015 | Nam et al. |
| 2011/0233648 A1 | 9/2011 | Seol et al. |
| 2012/0230103 A1* | 9/2012 | Choe .................. G11C 16/0483 365/185.2 |
| 2015/0003150 A1* | 1/2015 | Aritome ............. G11C 16/3427 365/185.02 |
| 2015/0003157 A1* | 1/2015 | Aritome ............. G11C 16/0408 365/185.11 |
| 2015/0380089 A1* | 12/2015 | Aritome ............. G11C 16/0408 365/185.11 |

\* cited by examiner

FIG. 24B

| FIRST S_OP(750) | P | P | P | Q | Q | Q | R | R | R |
|---|---|---|---|---|---|---|---|---|---|
| SECOND S_OP(760) | P | Q | R | P | Q | R | P | Q | R |

P:SIMULTANEOUS C-F    Q:SIMULTANEOUS F    R:SEQUENTIAL F

NONVOLATILE MEMORY DEVICES AND METHODS OF OPERATING THE SAME

CROSS-REFERENCE TO RELATED APPLICATION

This U.S. non-provisional application claims priority under 35 USC §119 to Korean Patent Application No. 10-2015-0159225, filed on Nov. 12, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to nonvolatile memory devices and/or methods of operating nonvolatile memory devices.

2. Discussion of Related Art

Semiconductor memory devices may be classified as volatile semiconductor memory devices and nonvolatile semiconductor memory devices. Volatile semiconductor memory devices may perform read and write operations at high speed. Contents stored in volatile memory devices may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device is an example of a nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc.

As high integration memory devices have recently become increasingly used, multi-bit memory devices storing multi-bit data in a memory cell have become more common.

SUMMARY

Example embodiments relate to provide a method of operating a nonvolatile memory device, capable of reducing time used for erase operation.

Example embodiments relate to provide a nonvolatile memory device that performs the method.

According to example embodiments, a method of operating a nonvolatile memory device is provided. The nonvolatile memory device includes a plurality of memory blocks. Each of the memory blocks includes cell strings formed vertically on a substrate. The cell strings are coupled to a plurality of bit-lines. The cell strings each include memory cells connected to a string selection transistor. The method includes performing an erase operation on a first memory block of the memory blocks in response to an erase command, performing an erase verification operation on the memory cells of the first memory block, performing a first sensing operation on the string selection transistors of each of the cell strings coupled to at least some bit-lines of the first memory block, and determining whether the first memory block is a fail block at least based on a result of the first sensing operation. The first sensing operation is based on a first sensing scheme selected among a plurality of sensing schemes.

According to example embodiments, a nonvolatile memory device includes a memory cell array, a voltage generator, an address decoder, a page buffer circuit, and a control circuit. The memory cell array includes a plurality of memory blocks. Each of the memory blocks includes a plurality of cell strings formed vertically on a substrate. The cell strings are coupled to a plurality of bit-lines. The cell strings each include memory cells connected to a string selection transistor and ground selection transistor. The voltage generator is configured to generate word-line voltages in response to control signals. The address decoder is configured to apply the word-line voltages to the memory cell array in response an address signal. The page buffer circuit is coupled to the memory cell array through the bit-lines. The control circuit is configured to control the voltage generator and the page buffer circuit. The control circuit is configured to perform an erase operation and an erase verification operation on a first memory block of the memory blocks in response to an erase command. The control circuit is configured control the voltage generator and the page buffer circuit such that the voltage generator and the page buffer circuit perform a first sensing operation on the string selection transistor of each of the cell strings coupled to at least some bit-lines of the first memory block. The first sensing operation is based on a first sensing scheme selected among a plurality of sensing schemes. The control circuit is configured perform selectively a second sensing operation on the ground selection transistor of each of the cell strings coupled to at least some bit-lines of the first memory block based on the result of the first sensing operation. The second sensing operation being based on a second sensing scheme selected among the plurality of sensing schemes.

According to example embodiments, a method of operating a nonvolatile memory device is provided. The nonvolatile memory device includes a plurality of memory blocks on a substrate. Each of the memory blocks includes a plurality of cell strings coupled to a plurality of bit lines. Each of the cell strings includes a plurality of memory cells connected to each other between a string selection transistor and a ground selection transistor on the substrate. The method includes performing an erase operation on a first memory block of the memory blocks, performing an erase verification operation on the first memory block, performing a first sensing operation on the string selection transistors of at least two cell strings of the first memory block, and determining whether the first memory block is a fail block using a result of the first sensing operation. The first sensing operation includes determining whether at least one of the string selection transistors of the at least two cell strings of the first memory block are in an off state or an on state using a first sensing scheme selected among a plurality of sensing schemes.

According to a method of operating a nonvolatile memory device, a time used for erase loop may be reduced by determining whether a memory block is a fail block by performing a sensing operation simultaneously or sequentially on at least one string selection transistors or at least one ground selection transistors after an erase verification operation on memory cells.

BRIEF DESCRIPTION OF THE DRAWINGS

Illustrative, non-limiting example embodiments will be more clearly understood from the following detailed description in conjunction with the accompanying drawings.

FIG. 24B is a table illustrating various combinations of sensing schemes employed as a first sensing operation and a second sensing operation in FIG. 24A.

DETAILED DESCRIPTION OF EXAMPLE EMBODIMENTS

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
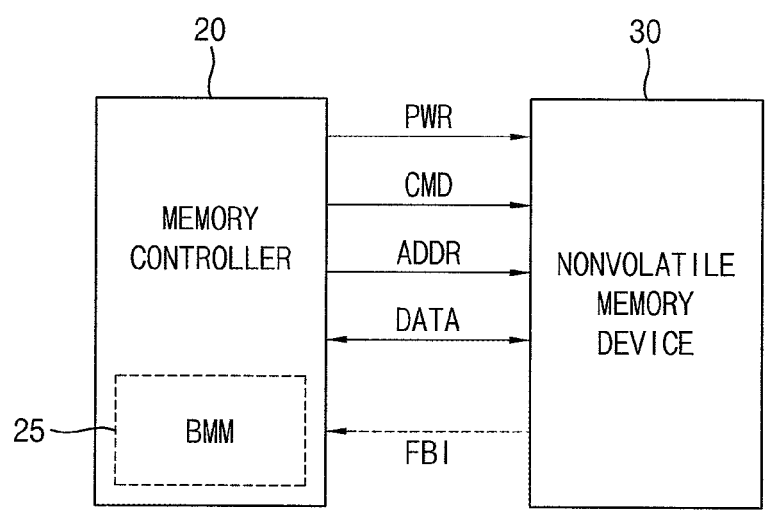
FIG. 1 is a block diagram illustrating a memory system according to example embodiments.

FIG. 1 is a block diagram illustrating a memory system according to example embodiments.

Referring to FIG. 1, a memory system (or, a nonvolatile memory system) 10 may include a memory controller 20 and at least one nonvolatile memory device 30.

The memory system 10 may include flash memory based data storage media such as a memory card, a universal serial bus (USB) memory and solid state drive (SSD).

The nonvolatile memory device 30 may perform an erase operation, a program operation and/or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a power PWR through a power line from the memory controller 20. The command CMD may include a command latch enable (CLE), an address latch enable (ALE), a chip enable (CE/), a write enable (WE/) and a read enable (RE/).

The nonvolatile memory device 30 may include a memory cell array including a plurality of memory blocks and may provide the memory controller 20 with a fail block information FBI about a fail block which includes at least one cell string whose performance is degraded. The memory controller 20 may include a block management module (BMM) 25 that receives the fail block information FBI. The block management module 25 may replace an address of the fail block with an address of a normal block when a host is to access the fail block.

Figure 2:
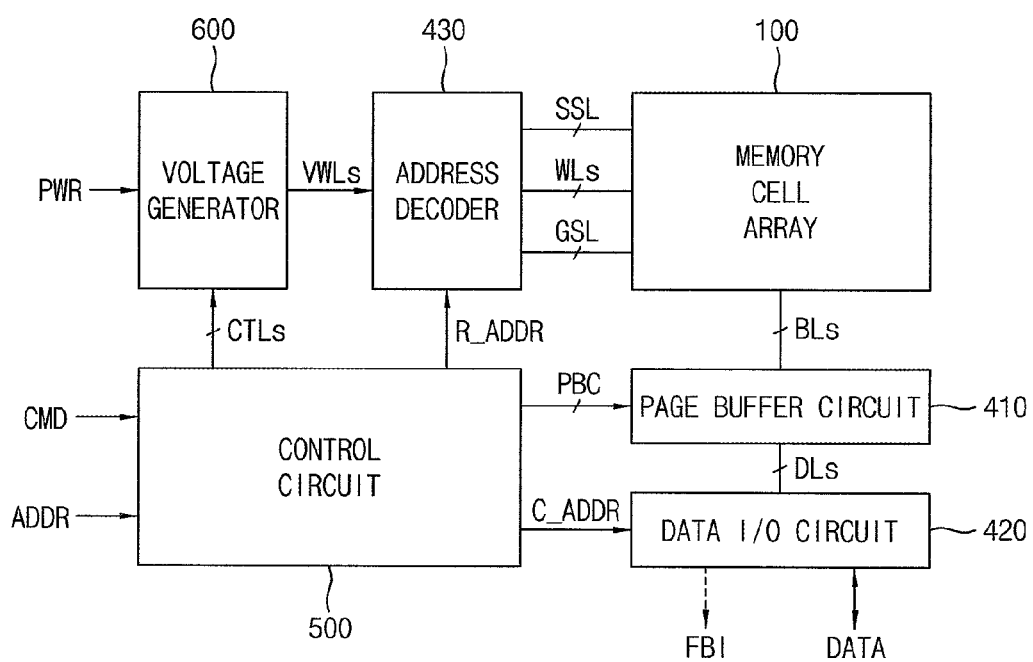
FIG. 2 is a block diagram illustrating the nonvolatile memory device in the memory system of FIG. 1 according to example embodiments.

FIG. 2 is a block diagram illustrating the nonvolatile memory device in the memory system of FIG. 1 according to example embodiments.

Referring to FIG. 2, the nonvolatile memory device 30 includes a memory cell array 100, an address decoder 430, a page buffer circuit 410, a data input/output circuit 420, a control circuit 500 and a voltage generator 600.

The memory cell array 100 may be coupled to the address decoder 430 through a at least one string selection line SSL, a plurality of word-lines WLs, and at least one ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In example embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

Alternatively, in example embodiments, the memory cell array 100 may be a two-dimensional memory cell array, which is formed on a substrate in a two-dimensional structure (or a horizontal structure).

Figure 3:
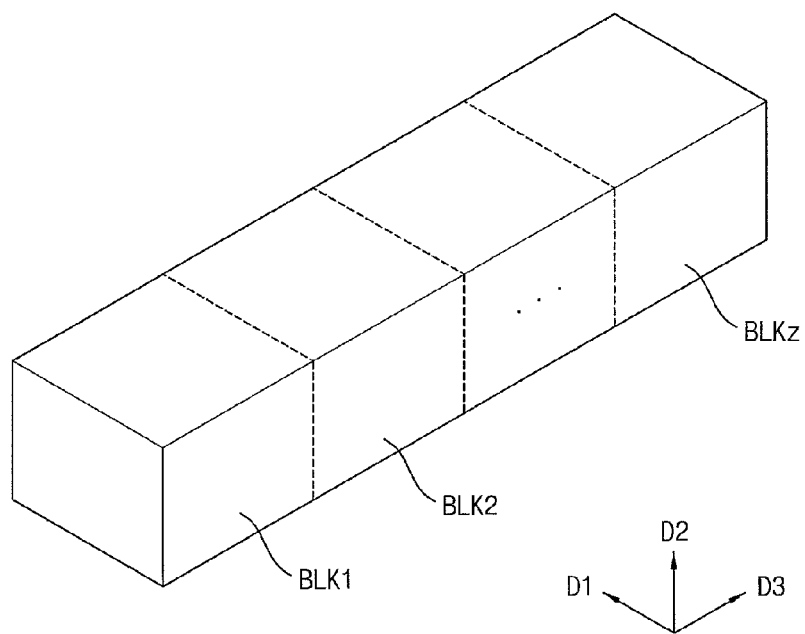
FIG. 3 is a block diagram illustrating the memory cell array in FIG. 2.

FIG. 3 is a block diagram illustrating the memory cell array in FIG. 2.

Referring to FIG. 3, the memory cell array 100 may include a plurality of memory blocks BLK1 to BLKz. The memory blocks BLK1 to BLKz are selected by the address decoder 430 in FIG. 2. For example, the address decoder 430 may select a memory block BLK corresponding to a block address among the memory blocks BLK1 to BLKz.

Figure 4:
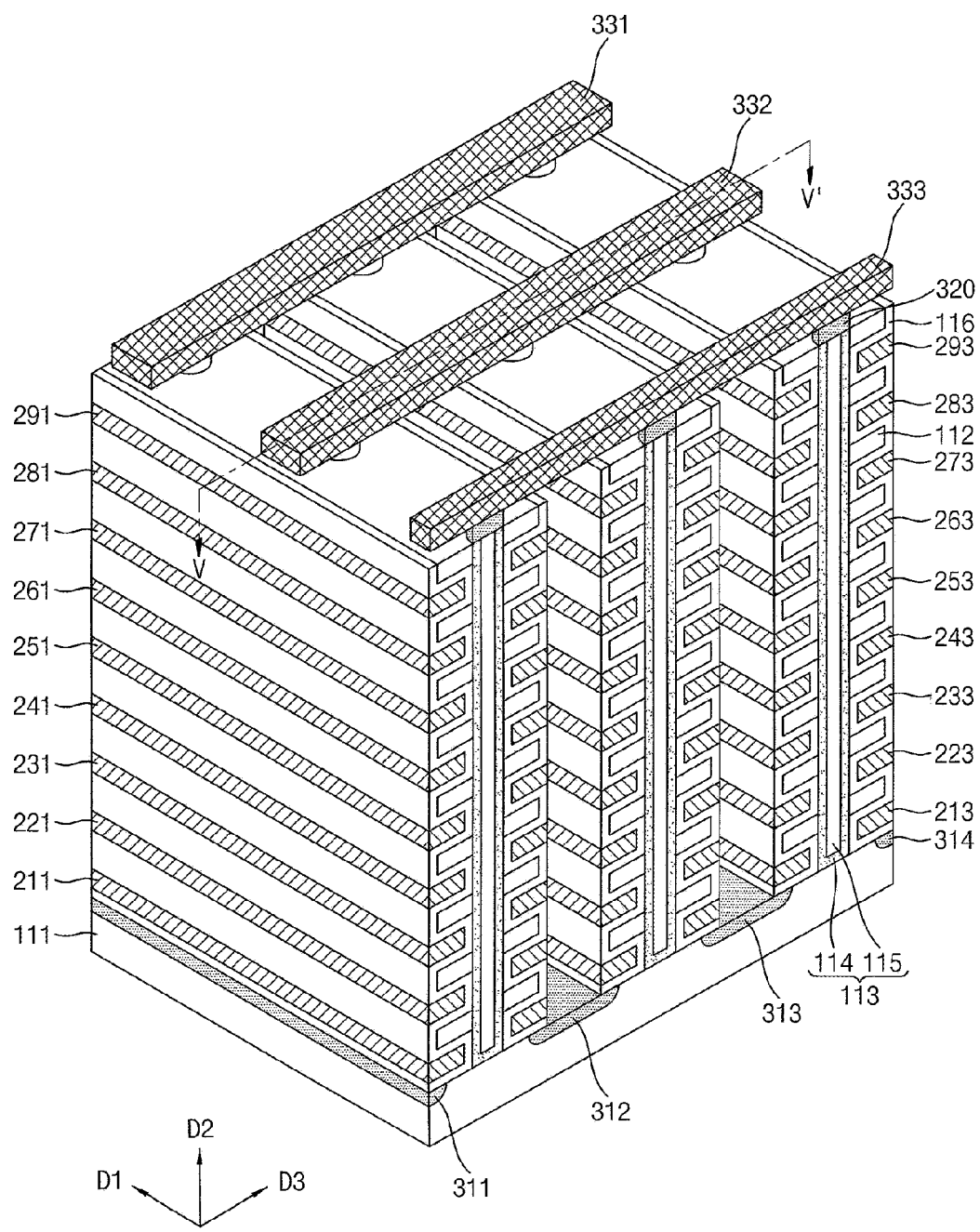
FIG. 4 is a perspective view illustrating one of the memory blocks of FIG. 3.
Figure 5:
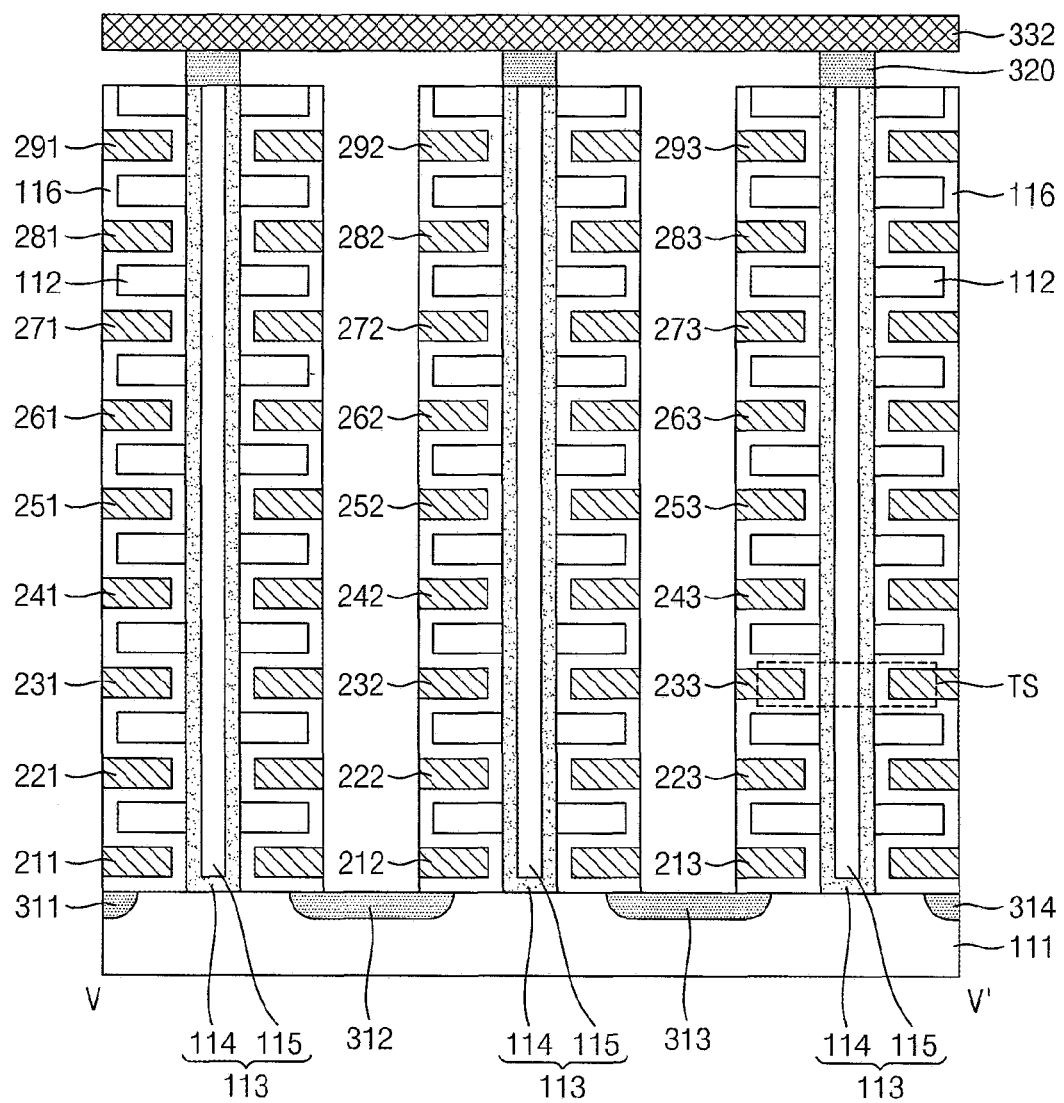
FIG. 5 is a sectional view taken along the line V-V' of the memory block of FIG. 4.

FIG. 4 is a perspective view illustrating one of the memory blocks of FIG. 3. FIG. 5 is a sectional view taken along the line V-V' of the memory block of FIG. 4.

Referring to FIGS. 4 and 5, the memory block BLKb includes structures extending along first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. The substrate 111 may have a p-type well (or a p-type pocket well). However, the conductive type of the substrate 111 is not limited to the p-type.

A plurality of doping regions 311 to 314 extending along the first direction D1 may be provided in the substrate 111. For example, the plurality of doping regions 311 to 314 may have a second type (e.g., a second conductive type) different from the first type of the substrate 111. The first to fourth doping regions 311 to 314 may have an n-type. However, the conductive type of the first to fourth doping regions 311 to 314 is not limited to the n-type.

A plurality of insulation materials 112 extending along the first direction D1 are sequentially provided along the second direction on a region of the substrate 111 between the first and second doping regions 311 and 312. For example, the plurality of insulation materials may be spaced apart from each other along the second direction D2 by a specific distance. Alternatively, at least some insulation materials 112 may be spaced apart from each other by different distances. The insulation materials 112 may include an insulation material such as an oxide layer.

A plurality of pillars 113 may penetrate the insulation materials along the second direction D2 and may be sequentially disposed along the first direction on a region of the substrate 111 between the first and second doping regions 311 and 312. For example, the plurality of pillars 113 penetrate the insulation materials 112 to contact the substrate 111.

For example, each pillar 113 may include a plurality of materials, such as a channel layer 114 and an internal material 115. The channel layer 114 may be a semiconductor. For example, a channel layer 114 of each pillar 113 may include a silicon material having a first type. For example, the channel layer 114 of each pillar 113 may include a silicon material having the same type as the substrate 111. The channel layer 114 of each pillar 113 may include p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the internal material 115 of each pillar 113 may include an air gap. The internal material 115 may be omitted, in which case the pillar 113 may have a rod shape.

An insulation layer 116 is provided along the exposed surfaces of the insulation materials 112, the pillars 113, and the substrate 111, on a region between the first and second doping regions 311 and 312. For example, the insulation layer 116 provided on the exposed surface in the second direction D2 of the last insulation material 112 may be removed.

For example, the thickness of the insulation layer 116 may be less than the half of the distance between adjacent insulation materials 112 among the insulation materials 112. A material besides the insulation materials 112 and the insulation layer 116 may be provided between the insulation layer 116 and the insulation materials 112. The material may be on a first insulation material among the insulation materials 112 and the insulation layer 116 may be provided on the top of a second insulation material 112 at the bottom of the first insulation material. First conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111. In other words, the insulation materials 112 and the conductive materials 211 to 291 may be alternately stacked on top of each other. The insulation layer 116 may extend between the insulation material 112 and the conductive materials 211 to 291.

A first conductive material extending along the first direction D1 is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

The width of each drain 320 may be greater than that of the pillar 113. For example, each drain 320 may be provided in a pad form on the top of the corresponding pillar 113. Each drain 320 may extend to a portion of the channel layer 114 of the corresponding pillar 113.

On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Hereinafter, the heights of the first conductive materials 211 to 291, 212 to 292, and 213 to 293 are described. The first conductive materials 211 to 291, 212 to 292, and 213 to 293 sequentially may have first to ninth heights from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 4 and 5, the pillars 113, the insulation layer 116, and the plurality of first conductive materials 211 to 291, 212 to 292, and 213 to 293 form a cell string. For example, each pillar 113, an adjacent region of the insulation layer 116, and an adjacent region of the first conductive materials 211 to 291, 212 to 292, and 213 to 293 form a cell string. The cell string includes a plurality of transistor structures TS.

Figure 6:
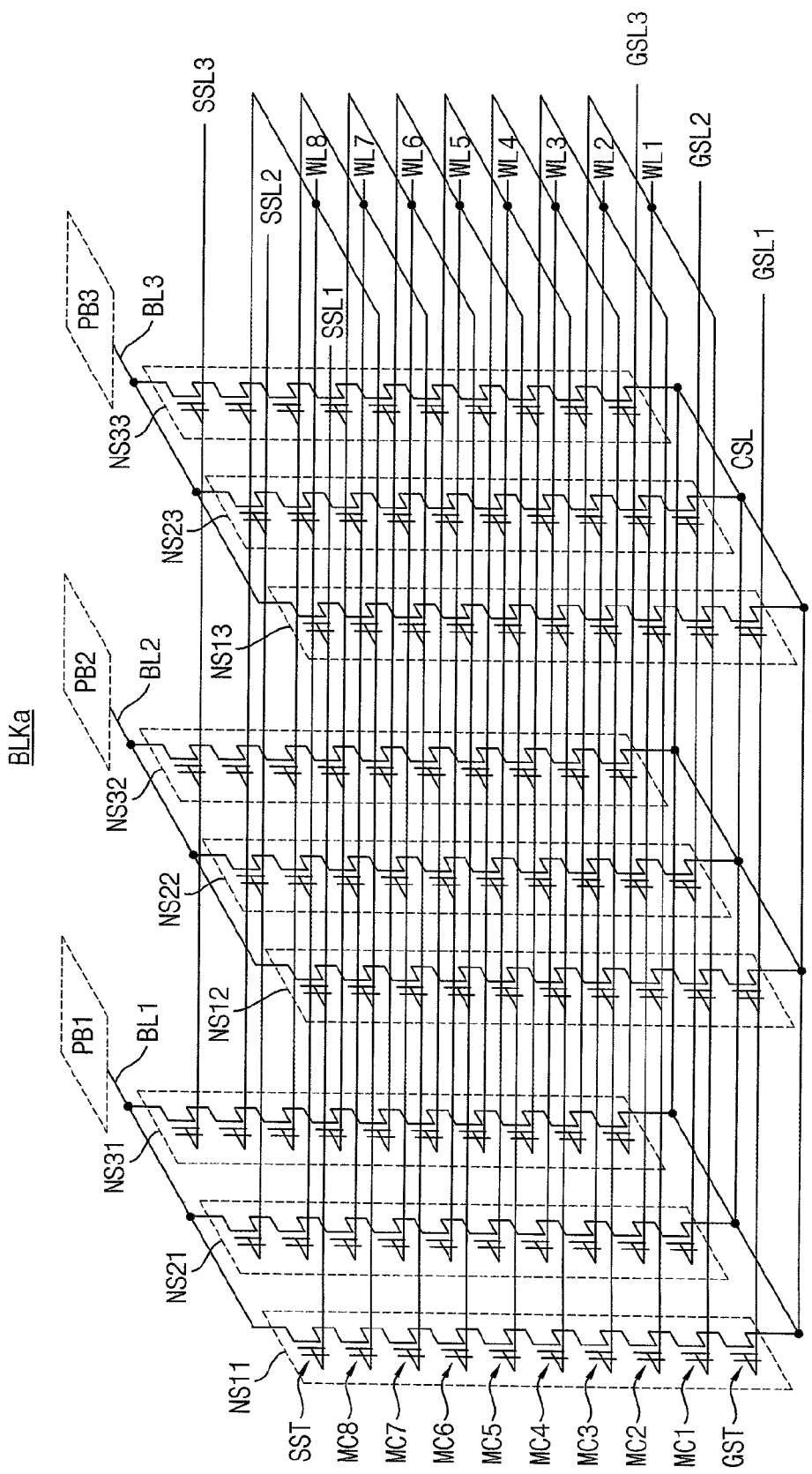
FIG. 6 is a circuit diagram illustrating an equivalent circuit of the memory block described with reference to FIGS. 4 and 5.

FIG. 6 is a circuit diagram illustrating an equivalent circuit of the memory block described with reference to FIGS. 4 and 5.

The memory block BLKa of FIG. 6 may be formed on a substrate in a three-dimensional structure (or a vertical structure). For example, a plurality of cell strings included in the memory block BLKa may be formed in a direction perpendicular to the substrate.

Referring to FIG. 6, the memory block BLKa may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, example embodiments are not limited thereto. In example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL. The bit-lines BL1, BL2 and BL3 may be coupled to corresponding page buffers PB1, PB2 and PB3.

In FIG. 6, each of the memory cell strings NS11 to NS33 is illustrated to include one string selection transistor SST and one ground selection transistor GST. However, example embodiments are not limited thereto. In example embodiments, each of the memory cell strings NS11 to NS33 may include two or more string selection transistors and two or more ground selection transistors.

Figure 8:
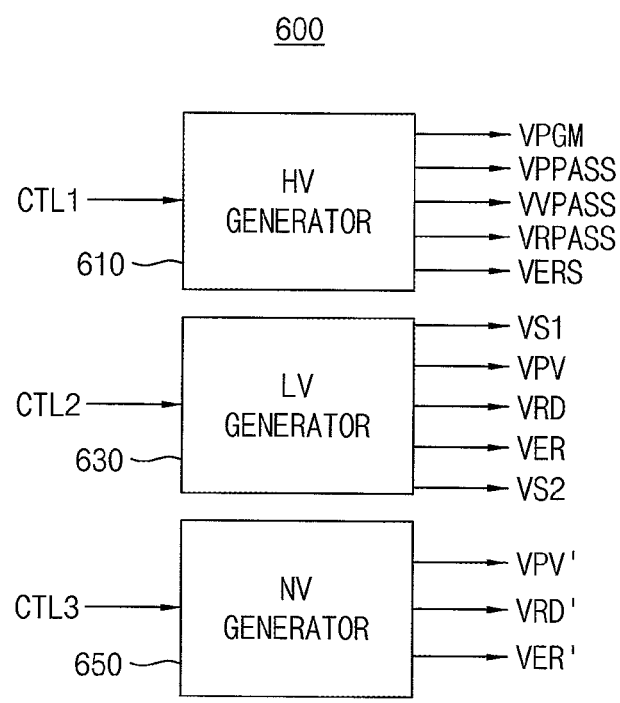
FIG. 8 is a block diagram illustrating the voltage generator in the nonvolatile memory device of FIG. 2 according to example embodiments.

Word-lines (e.g., WL1) having the same height may be commonly connected, and the ground selection lines GSL1 to GSL3 and the string selection lines SSL1 to SSL3 may be separated. In FIG. 8, the memory block BLKa is illustrated to be coupled to eight word-lines WL1 to WL8 and three bit-lines BL1 to BL3. However, example embodiments are not limited thereto. In example embodiments, the memory cell array 100 may be coupled to any number of word-lines and bit-lines.

Referring again to FIG. 2, the control circuit 500 may receive a command signal CMD and an address signal ADDR from an external device (e.g., the memory controller 20), and control an erase loop, a program loop and a read operation of the nonvolatile memory device 30 based on the command signal CMD and the address signal ADDR. The program loop may include a program operation and a program verification operation. The erase loop may include an erase operation, an erase verification operation, and at least one sensing operation.

For example, the control circuit 500 may generate control signals CTLs, which are used for controlling the voltage generator 600, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 100 through the at least one string selection line SSL, the plurality of word-lines WLs, and the at least one ground selection line GSL. During the program operation or the read operation, the address decoder 430 may determine one of the plurality of word-lines WLs as a first word-line (e.g., a selected word-line) and determine rest of the plurality of word-lines WLs except for the first word-line as unselected word-lines based on the row address R_ADDR.

The voltage generator 600 may generate word-line voltages VWLs, which are used for the operation of the nonvolatile memory device 30, based on the control signals CTLs. The word-line voltages VWLs may be applied to the plurality of word-lines WLs through the address decoder 430.

For example, during the erase operation, the voltage generator 600 may apply an erase voltage to a well of the memory block and may apply a ground voltage to entire word-lines of the memory block. During the erase verification operation, the voltage generator 600 may apply an erase verification voltage to the entire word-lines of the memory block or sequentially apply the erase verification voltage to word-lines in a word-line basis. During the at least one sensing operation, the voltage generator 600 may apply a sensing voltage to at least one string selection transistor and at least one ground selection transistor coupled to some bit-lines of a memory block.

For example, during the program operation, the voltage generator 600 may apply a program voltage to the first word-line and may apply a program pass voltage to the unselected word-lines. In addition, during the program verification operation, the voltage generator 600 may apply a program verification voltage to the first word-line and may apply a verification pass voltage to the unselected word-lines.

For example, during the read operation, the voltage generator 600 may apply a read voltage to the first word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In example embodiments, one page buffer may be connected to one bit-line. Alternatively, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DL. During the program operation, the data input/output circuit 410 may receive program data DATA from an external device (e.g., the memory controller 20) and provide the program data DATA to the page buffer circuit 410 based on the column address C_ADDR received from the control circuit 500. During the read operation, the data input/output circuit 420 may provide read data DATA, which are stored in the page buffer circuit 410, to the external device based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
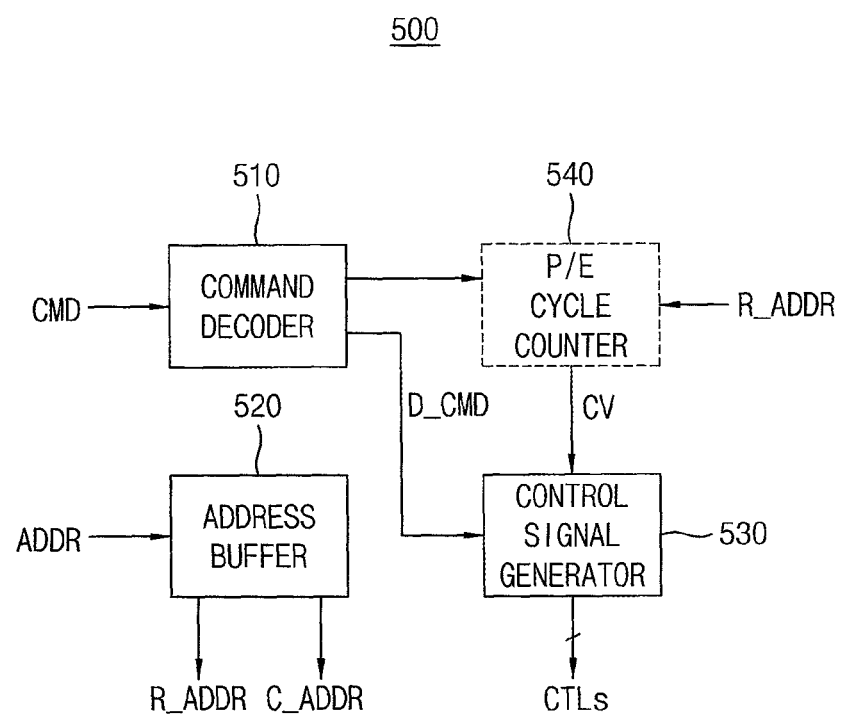
FIG. 7 is a block diagram illustrating the control circuit in the nonvolatile memory device of FIG. 2 according to example embodiments.

FIG. 7 is a block diagram illustrating the control circuit in the nonvolatile memory device of FIG. 2 according to example embodiments.

Referring to FIG. 7, the control circuit 500 includes a command decoder 510, an address buffer 520 and a control signal generator 530. The control circuit 500 may further include a program/erase cycle counter 540. Alternatively, the program/erase cycle counter 540 may be omitted.

The command decoder 510 decodes the command CMD and provides a decoded command D_CMD to the control signal generator 530. The command decoder 510 provides the decoded command D_CMD to the program/erase cycle counter 540 when the decoded command D_CMD is a program command or an erase command.

The address buffer 520 receives the address signal ADDR, provides the row address R_ADDR to the address decoder 430 and the program/erase cycle counter 540 and provides the column address C_ADDR to the data input/output circuit 420.

The program/erase cycle counter 540 counts a number of program/erase cycle on the selected memory cells based on the decoded command D_CMD and the row address R_ADDR and provides the comparison unit 560 with a counting value CV. The counting value CV indicates the counted number of the program/erase cycle on the selected memory cells. The counting value CV may indicates a programmed number of memory cells of a particular memory block after the memory block being erased.

The control signal generator 530 receives the decoded command D_CMD, generates the control signals CTLs based on an operation directed by the decoded command D_CMD and the number of the program/erase cycles and provides the control signals CTLs to the voltage generator 600. The control signal generator 530 may further receive counting value CV and generate the control signals CTLs based on the counted number of the program/erase cycle on the selected memory cells.

FIG. 8 is a block diagram illustrating the voltage generator in the nonvolatile memory device of FIG. 2 according to example embodiments.

Referring to FIG. 8, the voltage generator 600 includes a high voltage generator 610 and a low voltage generator 630. The voltage generator 600 may further include a negative voltage generator 650.

The high voltage generator 610 may generate a program voltage PGM, a program pass voltage VPPASS, a verification pass voltage VVPASS, a read pass voltage VRPASS and an erase voltage VERS according to operations directed by the decoded command D_CMD, in response to a first control signal CTL1. The program voltage PGM may be applied to the first word-line. The program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the number of the program/erase cycles indicated by the comparison signal CS.

The low voltage generator 630 may generate a program verification voltage VPV, a read voltage VRD, an erase verification voltage VER, a first sensing voltage VS1 and a second sensing voltage VS2 according to operations directed by the decoded command D_CMD, in response to a second control signal CTL2. The program verification voltage VPV, the read voltage VRD and the erase verification voltage VER may be applied to the first word-line according to operation of the nonvolatile memory device 100. The first sensing voltage VS1 and the second sensing voltage VS2 may be applied to at least one string selection line and at least one ground selection line. The second control signal CTL2 may include a plurality of bits which indicate the operations directed by the decoded command D_CMD.

The negative voltage generator 650 may generate a program verification voltage VPV', a read voltage VRD' and an erase verification voltage VER' which have negative levels according to operations directed by the decoded command D_CMD, in response to a third control signal CTL3. The third control signal CTL3 may include a plurality of bits which indicate the operations directed by the decoded command D_CMD and the number of the program/erase cycles indicated by the comparison signal CS.

Figure 9:
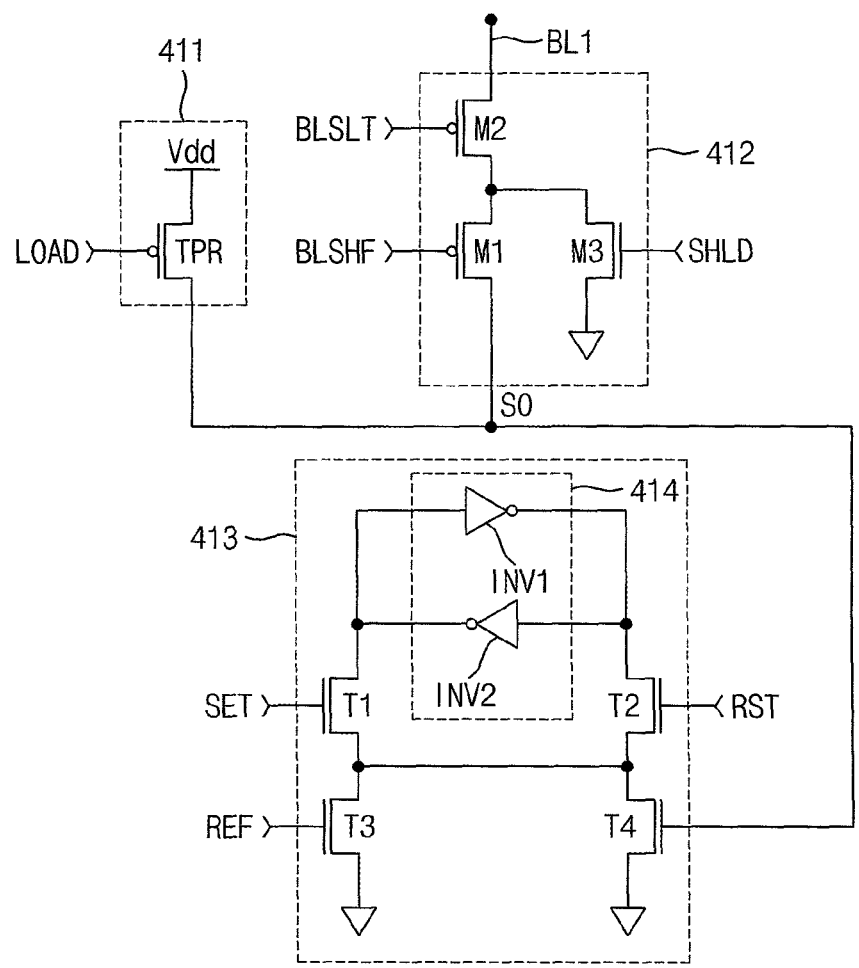
FIG. 9 is a circuit diagram illustrating one of page buffers in the page buffer circuit in the nonvolatile memory device of FIG. 2 according to example embodiments.

FIG. 9 is a circuit diagram illustrating one of page buffers in the page buffer circuit in the nonvolatile memory device of FIG. 2 according to example embodiments.

In FIG. 9, a page buffer PB1 coupled to the bit-line BL1 in FIG. 6 is illustrated.

Referring to FIG. 9, the page buffer PB1 includes a precharge circuit 411, a switch circuit 412 and a sense and latch circuit 413.

The precharge circuit 411, the switch circuit 412 and the sense and latch circuit 413 of the page buffer PB1 may operate responsive to a control signal PBC of the control circuit 500. The control signal PBC may include a load signal LOAD, a bit-line voltage control signal BLSHF, a bit-line selection signal BLSLT, a shield signal SHLD, and so on.

The precharge circuit 411 may supply a precharge voltage Vdd to a sense node SO. The precharge circuit 411 may include a precharge transistor TPR which is turned on or off according to the load signal LOAD.

The switch circuit 412 may include transistors M1, M2, and M3. The transistor M1 may precharge the bit-line BL1 to a desired (and/or alternatively predetermined) voltage level in response to the bit-line voltage control signal BLSHF. The transistor M2 may select the bit-line BL1 in response to the bit-line selection signal BLSLT. The transistor M3 may discharge the bit-line BL1 in response to the shield signal SHLD.

The sense and latch circuit 413 may detect a voltage level of the sense node SO. Data may be latched according to the detected voltage level of the sense node SO. The sense and latch circuit 413 may include a latch circuit 414 and transistors T1 to T4. The latch circuit 414 includes inverters INV1 and INV2. The transistor T1 includes a gate receiving a set signal SET, the transistor T2 includes a gate receiving a reset signal RST, the transistor T3 includes a gate receiving a refresh signal REF and the transistor T4 includes a gate coupled to the sense node SO. The sense and latch circuit 413 may operate responsive to control signals SET, RST and REF included in the control signal PBC.

Figure 10:
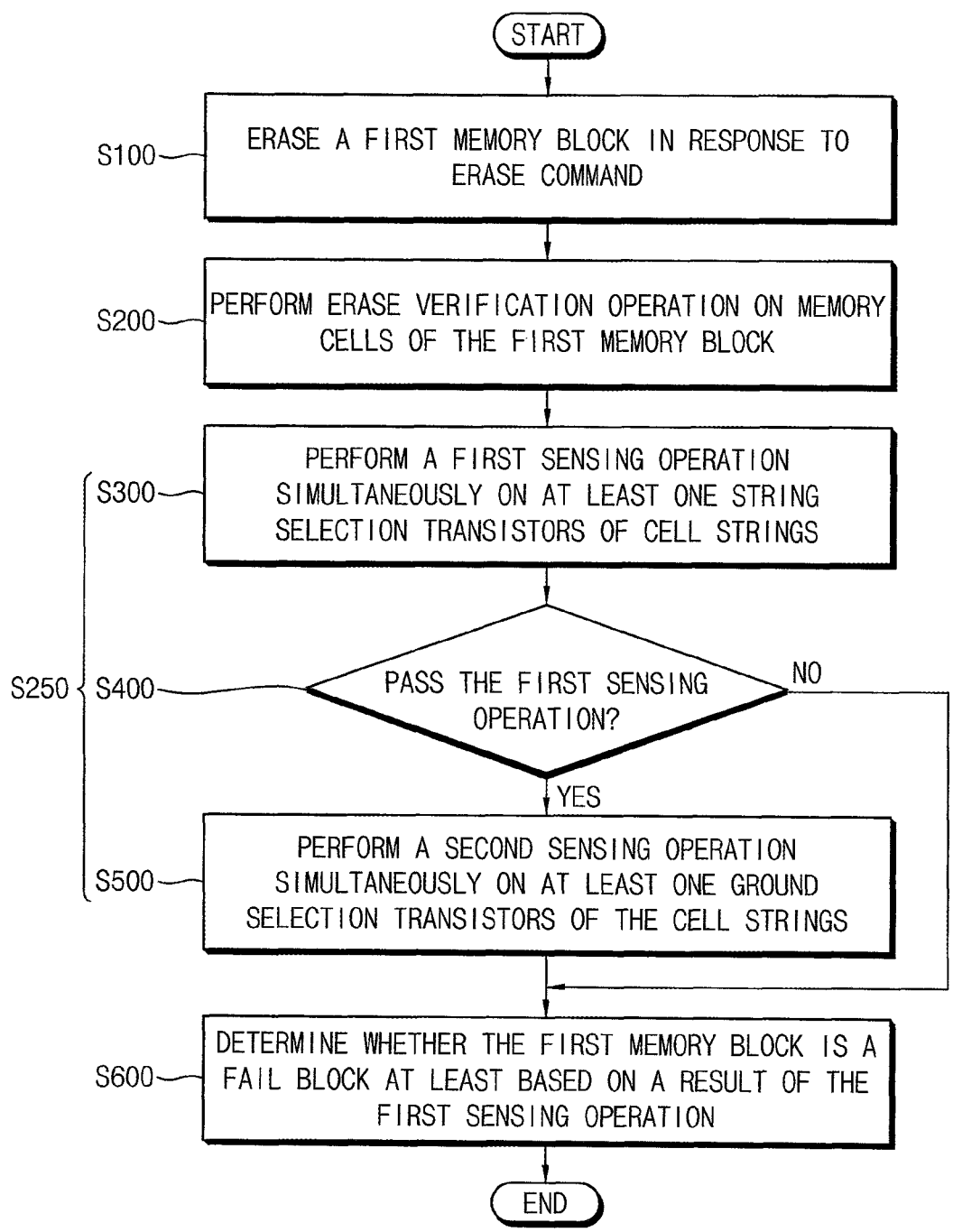
FIG. 10 is a flow chart illustrating a method of operating a nonvolatile memory device according to example embodiments.

FIG. 10 is a flow chart illustrating a method of operating a nonvolatile memory device according to example embodiments.

The method of operating a nonvolatile memory device of FIG. 10 may be performed by the nonvolatile memory device 30 of FIG. 2.

Referring to FIGS. 1 through 10, when the nonvolatile memory device 30 receives an erase command from the memory controller 20, the voltage generator 600 applies an erase voltage VERS to a first memory block selected from the memory blocks BLK1~BLKz under control of the control circuit 500 to perform an erase operation on the first memory block (S100). The nonvolatile memory device 30 performs an erase verification operation on the first memory block by applying an erase verification voltage to word-lines coupled to the memory cells of the first memory block (S200).

The nonvolatile memory device 30 performs simultaneously a first sensing operation using at least one sensing voltage on at least one string selection transistors coupled to memory cells of each cell strings coupled to some bit-lines of the first memory block (S300). The nonvolatile memory device 30 determines whether the at least one string selection transistors are off-states based on a result of the first sensing operation (S400). When the at least one string selection transistors are off-states (YES in S400), the nonvolatile memory device 30 performs simultaneously a second sensing operation using at least one sensing voltage on at least one ground selection transistors coupled to the memory cells of each cell strings coupled to some bit-lines of the first memory block (S500). The nonvolatile memory device 30 determines whether the first memory block is a fail block based on the result of the first sensing operation and a result of the second sensing operation (S600).

When at least one of the at least one string selection transistors are not off-states (NO in S400), the nonvolatile memory device 30 determines the first block as the fail block based on the result of the first sensing operation (S600).

In FIG. 10, the steps S300, S400 and S500 may constitute a step of performing a sensing operation on selection transistors (S250).

The nonvolatile memory device 30 determines whether the first memory block is a fail block at least based on the result of the first sensing operation and may provide a block management module 25 of the memory controller 20 with a fail block information FBI indicating that the first memory block is a fail block, when the first memory block is a fail block.

The method of FIG. 10 may be performed on cell strings coupled to entire bit-lines of one memory block or may be performed on cell strings coupled to some bit-lines which are selectively precharged of bit-lines of one memory block.

Figure 11:
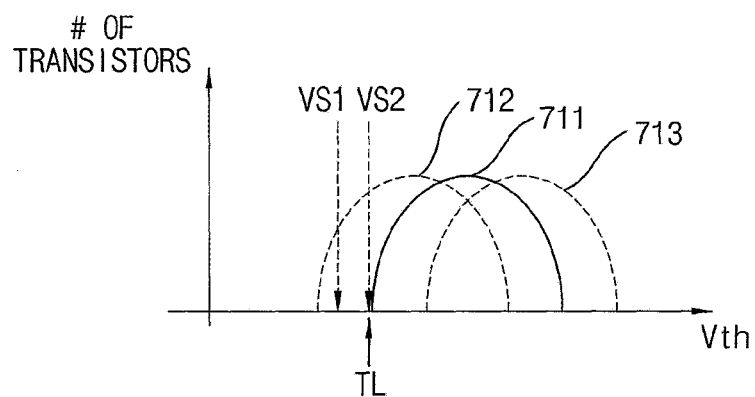
FIG. 11 illustrates a threshold voltage distribution of the string selection transistor or the ground selection transistor in each of cell strings in the memory block of FIG. 6.

FIG. 11 illustrates a threshold voltage distribution of the string selection transistor or the ground selection transistor in each of cell strings in the memory block of FIG. 6.

Referring to FIG. 11, the string selection transistor SST or the ground selection transistor GST may have a threshold voltage distribution denoted by a reference numeral 711. When the program/erase cycle increases and the cell string is degraded, the string selection transistor SST or the ground selection transistor GST may have a threshold voltage distribution denoted by a reference numeral 712. When the string selection transistor SST or the ground selection transistor GST is over-programmed, the string selection transistor SST or the ground selection transistor GST may have a threshold voltage distribution denoted by a reference numeral 713.

Figure 12:
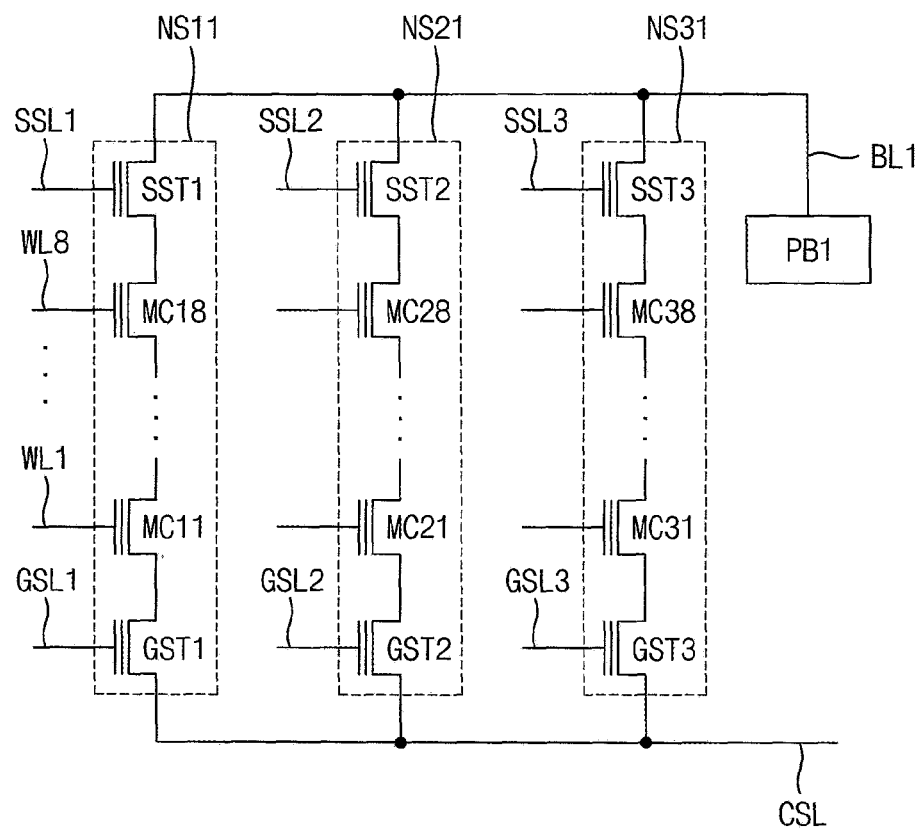
FIG. 12 illustrates a portion of a memory block to which the method of FIG. 10 is applied.
Figure 13:
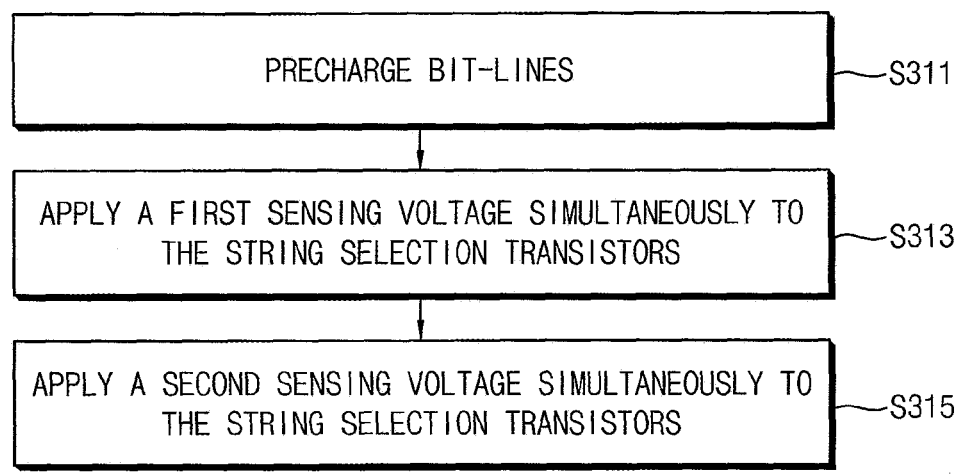
FIG. 13 illustrates an example of the first sensing operation of FIG. 10.
Figure 14:
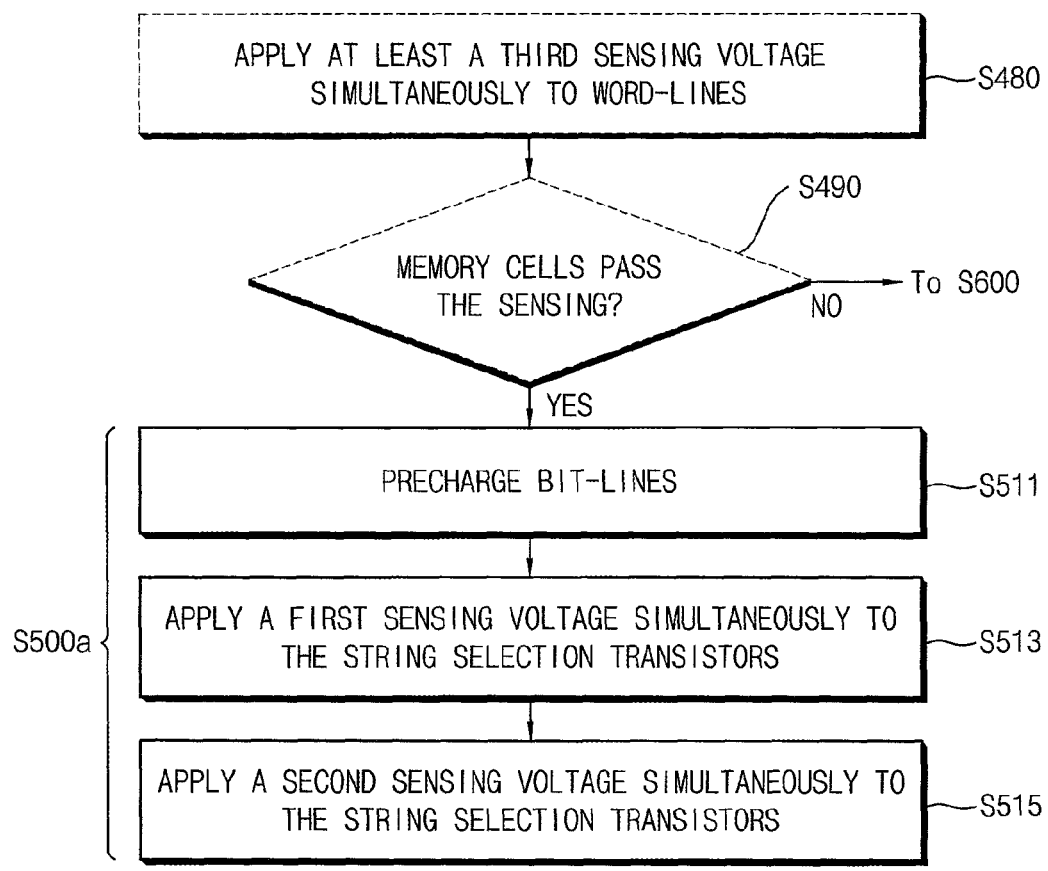
FIG. 14 illustrates an example of the second sensing operation of FIG. 10.

FIG. 12 illustrates a portion of a memory block to which the method of FIG. 10 is applied, FIG. 13 illustrates an example of the first sensing operation of FIG. 10 and FIG. 14 illustrates an example of the second sensing operation of FIG. 10.

Figure 15:
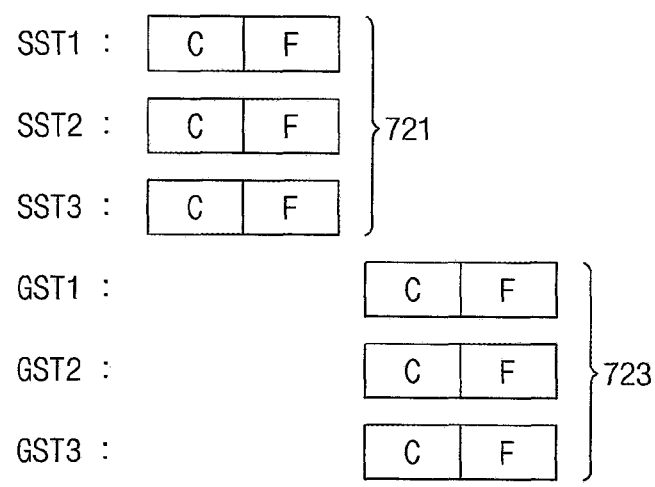
FIG. 15 illustrates the method of FIG. 10 conceptually.

FIG. 15 illustrates the method of FIG. 10 conceptually.

In FIGS. 12 through 15, it is assumed that each of the cell strings NS11~NS31 coupled to the bit-line BL1 includes one string selection transistor and one ground selection transistor.

Referring to FIGS. 6 and 11 through 15, for performing the first sensing operation (S300a), the nonvolatile memory device 30 precharges the entire bit-lines BL1~BL3 of the first memory block (S311). The nonvolatile memory device 30 performs a coarse sensing C to apply simultaneously a first sensing voltage VS1 to the string selection transistors SST1~55T3 of the cell strings NS11~NS33 coupled to the bit-lines BL1~BL3 which are precharged (S313), and then performs a fine sensing F to apply simultaneously a second sensing voltage VS2 different from the first sensing voltage VS1 to the string selection transistors SST1~SST3 (S315, 721). The first sensing voltage VS1 has a voltage level lower than a target level TL for sensing a lower margin of the threshold voltage distribution of the string selection transistors SST1~SST3 in normal states and the second sensing voltage VS2 has the target level TL.

At least one of the string selection transistors SST1~SST3, which has an off-state by the coarse sensing C using the first sensing voltage VS1, and the fine sensing F using the second sensing voltage VS2 is performed on the string selection transistors which have an off-state. During the coarse sensing C and the fine sensing F, the voltage generator 600 may apply the read pass voltage VRPASS to the word-lines WL1~WL8 and the ground selection lines GSL1~GSL3.

When at least one of the string selection transistors SST1~SST3 does not pass the first sensing operation, the first memory block is determined as the fail block because a voltage level of the sense node SO is changed.

When the string selection transistors SST1~SST3 pass the first sensing operation, for performing the second sensing operation (S500a), the nonvolatile memory device 30 pre-charges the entire bit-lines BL1~BL3 again (S511). The nonvolatile memory device 30 performs a coarse sensing C to apply simultaneously the first sensing voltage VS1 to the ground selection transistors GST1~GST3 of the cell strings NS11~NS33 (S513), and then performs a fine sensing F to apply simultaneously the second sensing voltage VS2 to the ground selection transistors GST1~GST3 (S515, 723). During the coarse sensing C and the fine sensing F, the voltage generator 600 may apply the read pass voltage VRPASS to the word-lines WL1~WL8 and the string selection lines SSL1~SSL3. The second sensing operation on the ground selection transistors GST1~GST3 may be selectively performed based on a result of the first sensing operation on the string selection transistors SST1~SST3.

For example, when the string selection transistor SST3 and the ground selection transistor GST3 of the cell string NS31 have the threshold voltage distribution 721 as the program/erase cycle increases, current flows from the page buffer PB1 to the common source line CSL through the cell string NS31 because the coarse C-fine F sensing is performed after the bit-line is precharged. Therefore, since the voltage level of the sense node SO is changed, the page buffer PB1 may determine whether the string selection transistor and the ground selection transistor of at least one of the cell strings NS11~NS31 based on a change of the voltage level of the sense node SO.

Figure 16:
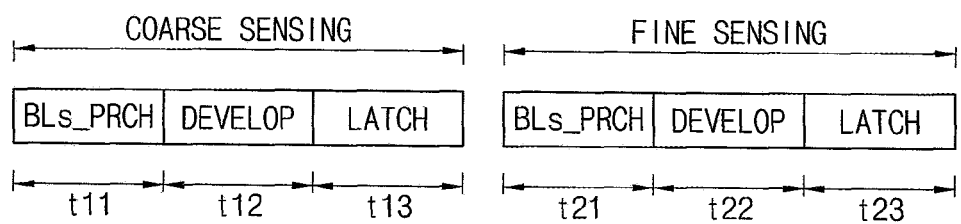
FIG. 16 is a timing diagram illustrating the first sensing operation and the second sensing operation in FIG. 15.

FIG. 16 is a timing diagram illustrating the first sensing operation and the second sensing operation in FIG. 15.

Referring to FIG. 16, a coarse-fine sensing using the first sensing voltage VS1 and the second sensing voltage VS2 that are different from each other, includes coarse sensing and fine sensing.

Each of the coarse sensing and fine sensing includes a bit-line pre-charge period BLs_PRCH, a development period DEVELOP, and a latch period LATCH. At the coarse sensing, all bit-lines are pre-charged during a pre-charge time t11. During a development time t12, currents of the pre-charged bit-lines vary according to threshold voltage of the string selection transistor or the ground selection transistor. During a latch time t13, variations of bit-line currents are sensed and latched in page buffer PB1. Selection transistors having off states are selected based on data latched via the coarse sensing. Fine sensing on the selection transistors having off states is performed.

For the fine sensing, bit-lines of the selection transistors selected via the coarse sensing are selected. The selected bit-lines are precharged during a pre-charge time t21. During a development time t22, currents of the precharged bit-lines vary according to threshold voltage of the string selection transistor or the ground selection transistor. During a latch time t23, variations of bit line currents are sensed and latched in the page buffer PB1. Whether selection transistors have on-states is determined based on data latched via the fine sensing.

In FIG. 14, a cell sensing operation using at least one cell sensing voltage is performed on the memory cells MC11~MC18, MC21~MC28 and MC31~MC38 before the second sensing operation is performed on the ground selection transistors GST1~GST3. A third sensing voltage whose level is lower than the target level is simultaneously applied to the word-lines on word-line basis and then a fourth sensing voltage having the target level is simultaneously applied to the word-lines on word-line basis for verify each threshold voltage of the memory cells MC11~MC18, MC21~MC28 and MC31~MC38 (S480).

Whether each of the memory cells MC11~MC18, MC21~MC28 and MC31~MC38 has on off-state may be determined based on a result of the cell sensing operation (S490). When each of the memory cells MC11~MC18, MC21~MC28 and MC31~MC38 has off-state (YES in S490), the second sensing operation is performed (S500a). When at least one of the memory cells MC11~MC18, MC21~MC28 and MC31~MC38 has on-state (NO in S490), the first memory block is determined as the fail block.

In addition, the cell sensing operation (S480 and S490) may be performed after the second sensing operation instead of the first sensing operation. The cell sensing operation (S480 and S490) may be performed when each of the string selection transistors SST1~SST3 has off state by the first sensing operation.

Figure 17:
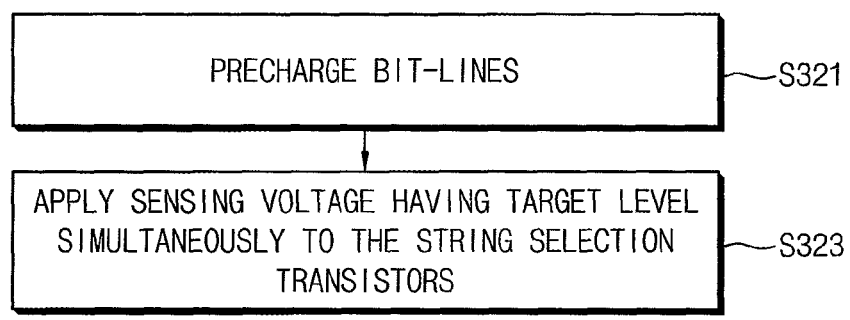
FIG. 17 illustrates an example of the first sensing operation of FIG. 10.
Figure 18:
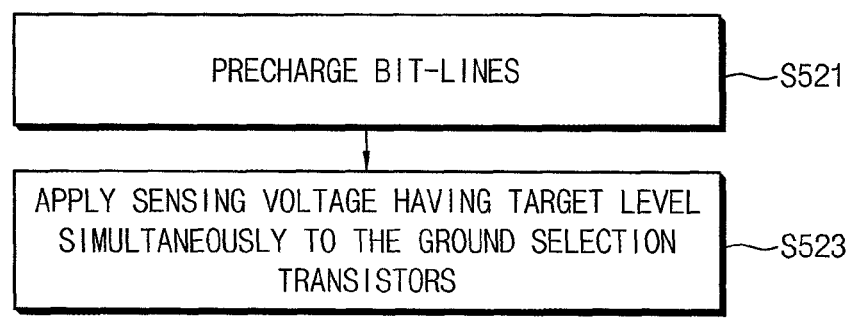
FIG. 18 illustrates an example of the second sensing operation of FIG. 10.
Figure 19:
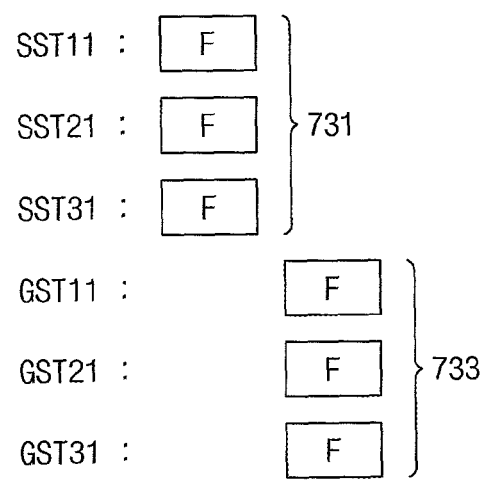
FIG. 19 illustrates the method of FIG. 10 conceptually.

FIG. 17 illustrates an example of the first sensing operation of FIG. 10, FIG. 18 illustrates an example of the second sensing operation of FIG. 10 and FIG. 19 illustrates the method of FIG. 10 conceptually.

Referring to FIGS. 6, 11, 12 through 17 and 19, for performing the first sensing operation (S300b), the nonvolatile memory device 30 precharges the entire bit-lines BL1~BL3 of the first memory block (S321). The nonvolatile memory device 30 performs a fine sensing F to apply simultaneously a sensing voltage VS2 to the string selection transistors SST1~SST3 of the cell strings NS11~NS33 coupled to the bit-lines BL1~BL3 which are precharged 731 (S323).

When at least one of the string selection transistors SST1~SST3 does not pass the first sensing operation, the first memory block is determined as the fail block because a voltage level of the sense node SO is changed.

When the string selection transistors SST1~SST3 pass the first sensing operation, for performing the second sensing operation (S500b), the nonvolatile memory device 30 pre-charges the entire bit-lines BL1~BL3 again (S521). The nonvolatile memory device 30 performs a fine sensing F to apply simultaneously the sensing voltage VS2 to the ground selection transistors GST1~GST3 of the cell strings NS11~NS33 733 (S523). The second sensing operation on the ground selection transistors GST1~GST3 may be selectively performed based on a result of the first sensing operation on the string selection transistors SST1~SST3.

Figure 20:
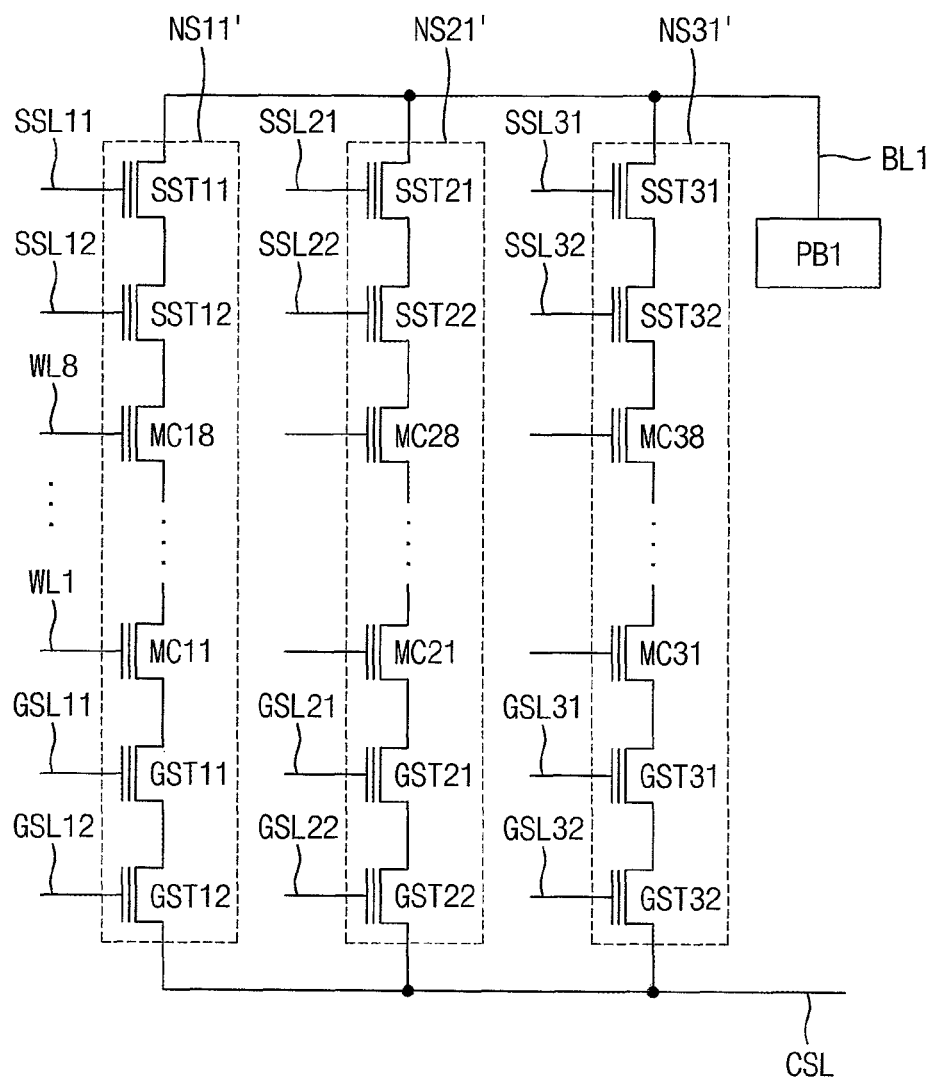
FIG. 20 illustrates a portion of a memory block to which the method of FIG. 10 is applied.

FIG. 20 illustrates a portion of a memory block to which the method of FIG. 10 is applied.

Figure 21:
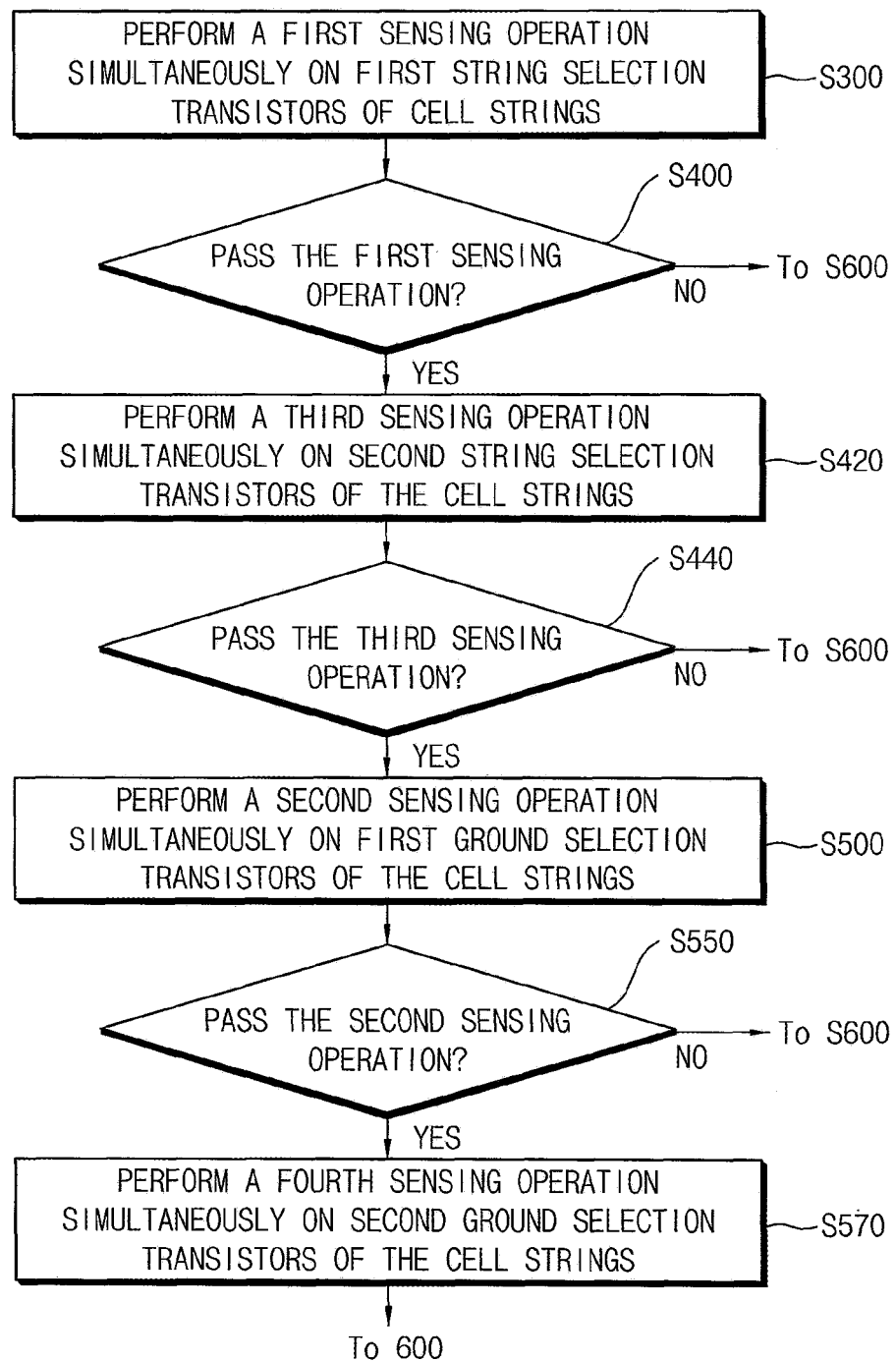
FIG. 21 illustrates an example of the first sensing operation preformed on the selection transistors in FIG. 10 when a method of operating a nonvolatile memory device is applied to the portion of the memory block of FIG. 20.

FIG. 21 illustrates an example of the first sensing operation preformed on the selection transistors in FIG. 10 when a method of operating a nonvolatile memory device is applied to the portion of the memory block of FIG. 20.

In FIGS. 20 and 21, it is assumed that each of cell strings NS11'~NS31' coupled to the bit-line BL1 includes two string selection transistors and two ground selection transistors.

Referring to FIGS. 6, 11, 20 and 21, for performing a sensing operation on the selection transistors (S250a), the nonvolatile memory device 30 performs simultaneously a first sensing operation on the first string selection transistors SST11~SST31 of the cell strings NS11'~NS31' (S300). The first sensing operation may be the coarse-fine sensing operation using the first sensing voltage VS1 and the second sensing operation VS2 as described with reference to FIG. 15. Alternatively, the first sensing operation may be the fine sensing operation using the second sensing operation VS2 as described with reference to FIG. 19.

Whether each of the first string selection transistors SST11~SST31 has an off state is determined based on the first sensing operation (S400). When at least one of the first string selection transistors SST11~SST31 does not have an off state (NO in S400), the first memory block is determined as a fail block (S600).

When each of the first string selection transistors SST11~SST31 has an off state by the first sensing operation (YES in S400), the nonvolatile memory device 30 performs simultaneously a third sensing operation using at least one sensing voltage on the second string selection transistors SST12~SST32 of the cell strings NS11'~NS31' (S420). Whether each of the second string selection transistors SST12~SST32 has an off state is determined based on the third sensing operation (S440). When at least one of the second string selection transistors SST12~SST32 does not have an off state (NO in S440), the first memory block is determined as a fail block (S600).

When each of the second string selection transistors SST12~SST32 has an off state by the third sensing operation (YES in S440), the nonvolatile memory device 30 performs simultaneously the second sensing operation on the first ground selection transistors GST11~GST31 (S500). Whether each of the first ground selection transistors GST11~GST31 has an off state is determined based on the second sensing operation (S550). When at least one of the first ground selection transistors GST11~GST31 does not have an off state (NO in S550), the first memory block is determined as a fail block (S600).

When each of the first ground selection transistors GST11~GST31 has an off state by the first sensing operation (YES in S550), the nonvolatile memory device 30 performs simultaneously a fourth sensing operation using at least one sensing voltage on the second ground selection transistors GST12~GST32 of the cell strings NS11'~NS31' (S570). The first memory block may be selectively determined as a fail block depending on whether each of the second ground selection transistors GST12~GST32 has an off state (S600).

Figure 22:
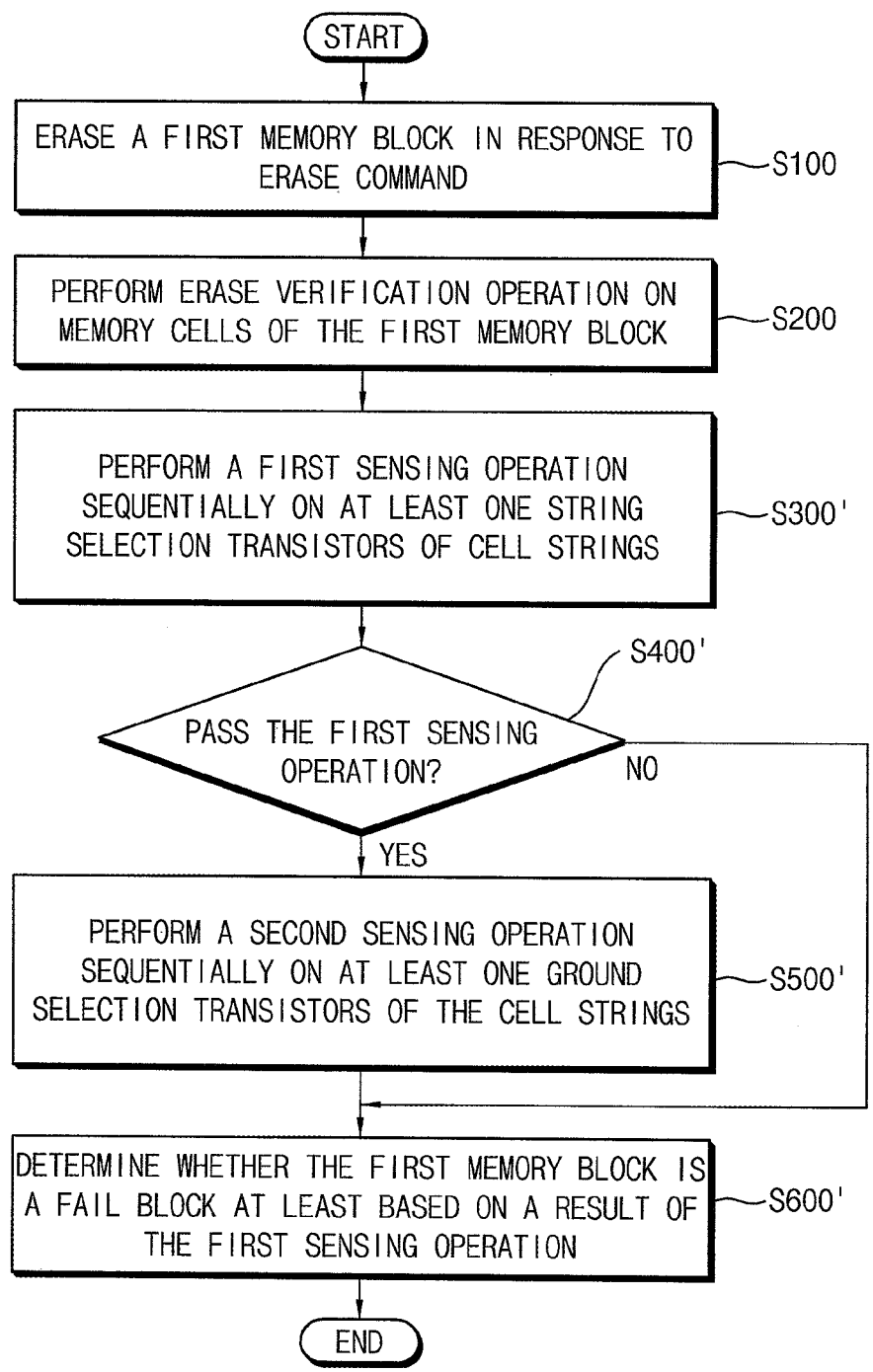
FIG. 22 is a flow chart illustrating a method of operating a nonvolatile memory device according to example embodiments.
Figure 23:
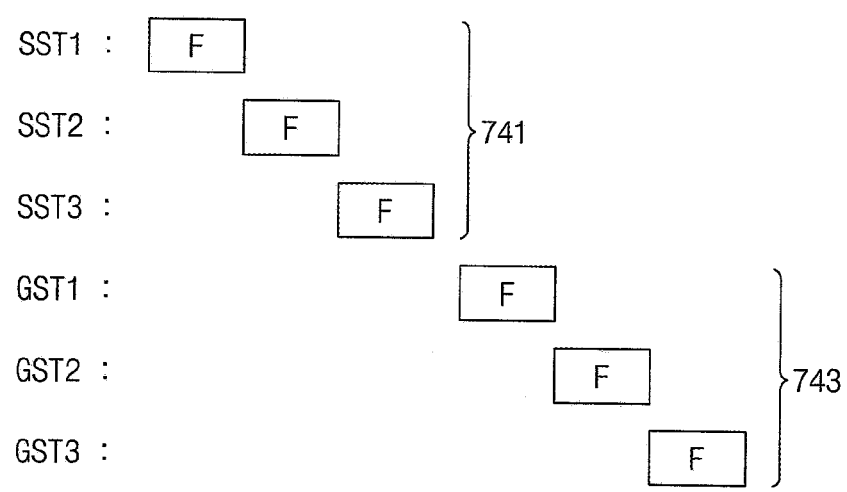
FIG. 23 illustrates the method of FIG. 22 conceptually.

FIG. 22 is a flow chart illustrating a method of operating a nonvolatile memory device according to example embodiments. FIG. 23 illustrates the method of FIG. 22 conceptually.

The method of operating a nonvolatile memory device of FIG. 22 may be performed by the nonvolatile memory device 30 of FIG. 2. In FIG. 23, it is assumed that each of the cell strings NS11~NS31 coupled to the bit-line BL1 includes one string selection transistor and one ground selection transistor as in FIG. 12.

Referring to FIGS. 2, 6, 11, 12, 22 and 23, when the nonvolatile memory device 30 receives an erase command from the memory controller 20, the voltage generator 600 applies an erase voltage VERS to a first memory block selected from the memory blocks BLK1~BLKz under control of the control circuit 500 to perform an erase operation on the first memory block (S100). The nonvolatile memory device 30 performs an erase verification operation on the first memory block by applying an erase verification voltage to word-lines coupled to the memory cells of the first memory block (S200).

The nonvolatile memory device 30 performs a first sensing operation using at least one sensing voltage sequentially 741 on at least one string selection transistors coupled to memory cells of each cell strings coupled to some bit-lines of the first memory block (S300'). The nonvolatile memory device 30 determines whether the at least one string selection transistors are off-states based on a result of the first sensing operation (S400'). When the at least one string selection transistors are off-states (YES in S400), the nonvolatile memory device 30 performs a second sensing operation using at least one sensing voltage sequentially 743 on at least one ground selection transistors coupled to the memory cells of each cell strings coupled to some bit-lines of the first memory block (S500'). The nonvolatile memory device 30 determines whether the first memory block is a fail block based on the result of the first sensing operation and a result of the second sensing operation (S600').

The nonvolatile memory device 30 determines whether the first memory block is a fail block at least based on the result of the first sensing operation and may provide a block management module 25 of the memory controller 20 with a fail block information FBI indicating that the first memory block is a fail block, when the first memory block is a fail block.

The method of FIG. 22 may be performed on cell strings coupled to entire bit-lines of one memory block or may be performed on cell strings coupled to some bit-lines which are selectively precharged of bit-lines of one memory block.

The description of the nonvolatile memory device and the method of operating a nonvolatile memory device with reference to FIGS. 1 through 23 may be similarly applied for checking (under-check) selection transistors having threshold voltage distribution 712 or for checking (upper-check) selection transistors having threshold voltage distribution 713.

Figure 24A:
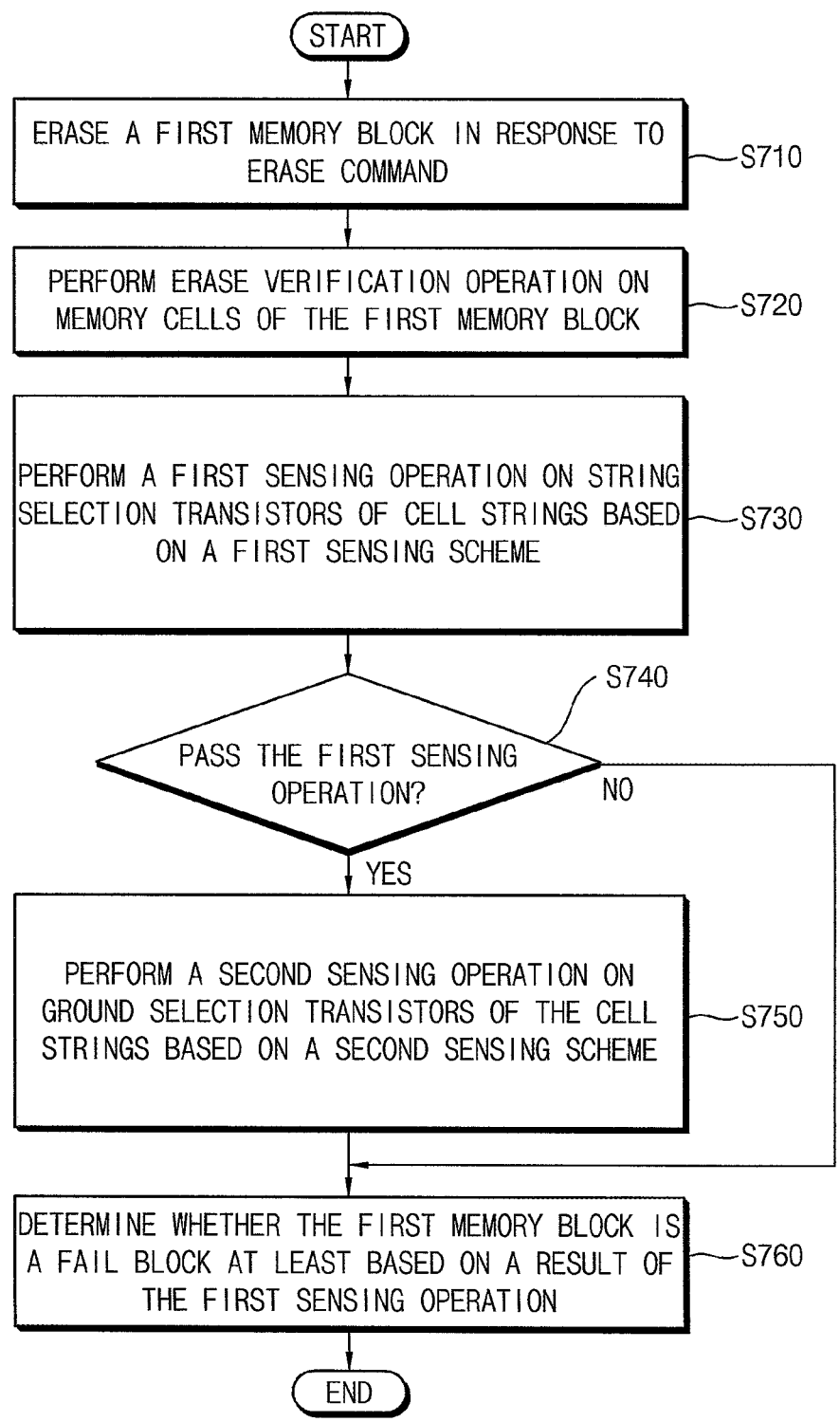
FIG. 24A is a flow chart illustrating a method of operating a nonvolatile memory device according to example embodiments.

FIG. 24A is a flow chart illustrating a method of operating a nonvolatile memory device according to example embodiments. FIG. 24B is a table illustrating various combinations of sensing schemes employed as a first sensing operation and a second sensing operation in FIG. 24A.

Referring to FIGS. 1 through 24B, when the nonvolatile memory device 30 receives an erase command from the memory controller 20, the voltage generator 600 applies an erase voltage VERS to a first memory block selected from the memory blocks BLK1~BLKz under control of the control circuit 500 to perform an erase operation on the first memory block (S710). The nonvolatile memory device 30 performs an erase verification operation on the first memory block by applying an erase verification voltage to word-lines coupled to the memory cells of the first memory block (S720).

The nonvolatile memory device 30 performs a first sensing operation, based on a first sensing scheme selected from a plurality of sensing schemes, on at least one string selection transistors coupled to memory cells of each cell strings coupled to some bit-lines of the first memory block (S730). The nonvolatile memory device 30 determines whether the at least one string selection transistors are off-states based on a result of the first sensing operation (S740). When the at least one string selection transistors are off-states (YES in S740), the nonvolatile memory device 30 performs a second sensing operation, based on a second sensing scheme selected from the sensing schemes, on at least one ground selection transistors coupled to the memory cells of each cell strings coupled to some bit-lines of the first memory block (S750).

The nonvolatile memory device 30 determines whether the first memory block is a fail block based on the result of the first sensing operation and a result of the second sensing operation (S600'). At least one of the at least one string selection transistors is not off-state (NO in S740), the nonvolatile memory device 30 determines the first memory block as a fail block based on the result of the first sensing operation (S760).

Referring to FIG. 24B, there is illustrated combinations of various sensing schemes P, Q and R which are respectively selected as the first sensing operation 750 on the at least one string selection transistors and as the second sensing operation 760 on the at least one ground selection transistors.

The sensing scheme P denotes the sensing operation that is simultaneously performed coarse-fine sensing using first sensing voltage and the second sensing voltage as described with reference to FIGS. 15 and 16. The sensing scheme Q denotes the sensing operation that is simultaneously performed fine sensing using one sensing voltage as described with reference to FIG. 19. The sensing scheme R denotes the sensing operation that is sequentially performed fine sensing using one sensing voltage as described with reference to FIG. 23. One of the sensing schemes P, Q and R is selected according to the characteristic of the at least one string selection transistors and is employed as the first sensing operation. One of the sensing schemes P, Q and R is selected according to the characteristic of the at least one ground selection transistors and is employed as the second sensing operation.

For example, the sensing scheme P may be selected as the first sensing scheme and the sensing scheme P may be selected as the second sensing scheme. A number of combinations of the first sensing operation 750 and the second sensing operation 760 may be nine as illustrated in FIG. 24B.

Figure 25:
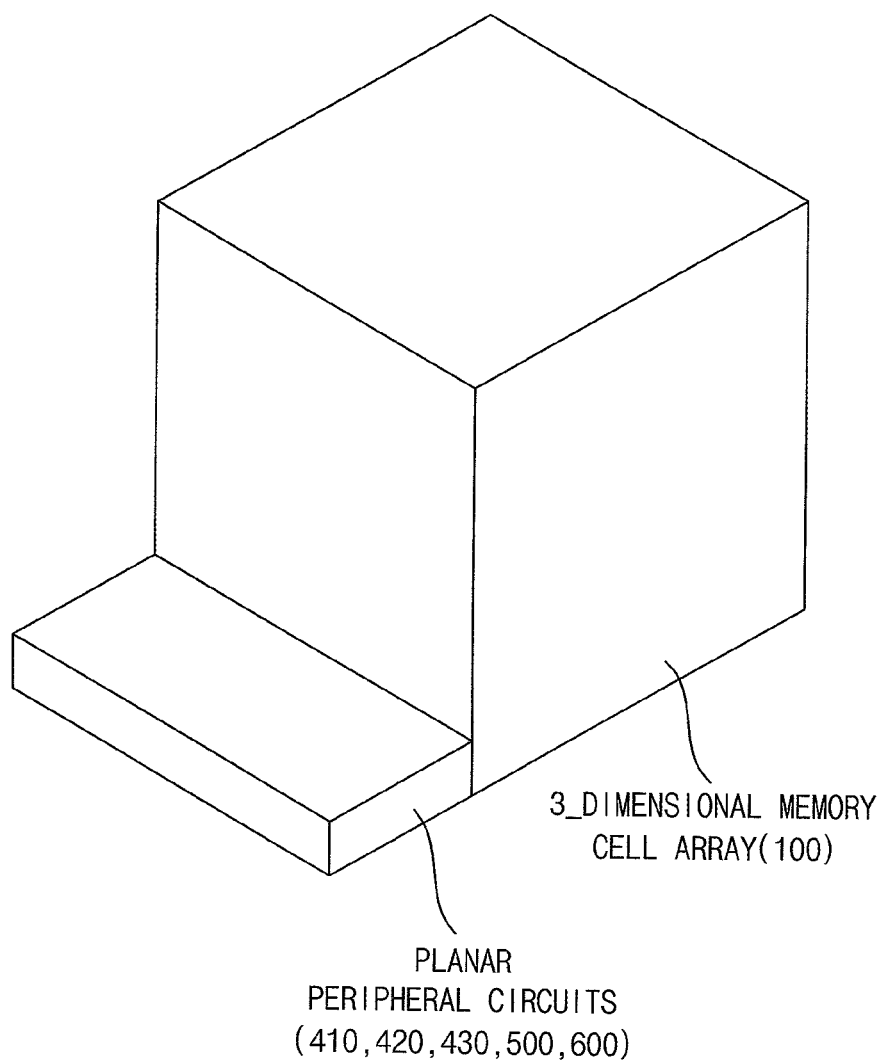
FIG. 25 is a perspective view illustrating a structure of the nonvolatile memory device described with reference to FIG. 2.

FIG. 25 is a perspective view illustrating a structure of the nonvolatile memory device described with reference to FIG. 2.

Referring to FIG. 25, the nonvolatile memory device 30 includes a three-dimensional memory cell array 100 and plane peripheral circuits 410, 420, 430, 500, and 600.

As described with reference to FIGS. 4 through 6, the memory cell array 100 includes memory cells stacked in a direction intersecting the substrate 111. That is, the memory cell array 100 has a three-dimensional structure in which memory cells are three-dimensionally arranged. The peripheral circuits 410, 420, 430, 500, and 600 include devices provided on the substrate 111 in a single layer. That is, the peripheral circuits 410, 420, 430, 500, and 600 include devices having a plane structure.

For example, it is illustrated that the peripheral circuits 410, 420, 430, 500, and 600 are provided at one side of the three-dimensional memory cell array 100. However, the position relationship of the peripheral circuits 410, 420, 430, 500, and 600 and their number are not limited thereto.

For example, the peripheral circuits 410, 420, 430, 500, and 600 may be provided on at least two sides of the three-dimensional memory cell array 100. Additionally, at least two three-dimensional memory cell arrays 100 are provided and the plane peripheral circuits 410, 420, 430, 500, and 600 may be provided on at least one side of each of at least two three-dimensional memory cell arrays 100.

Figure 26:
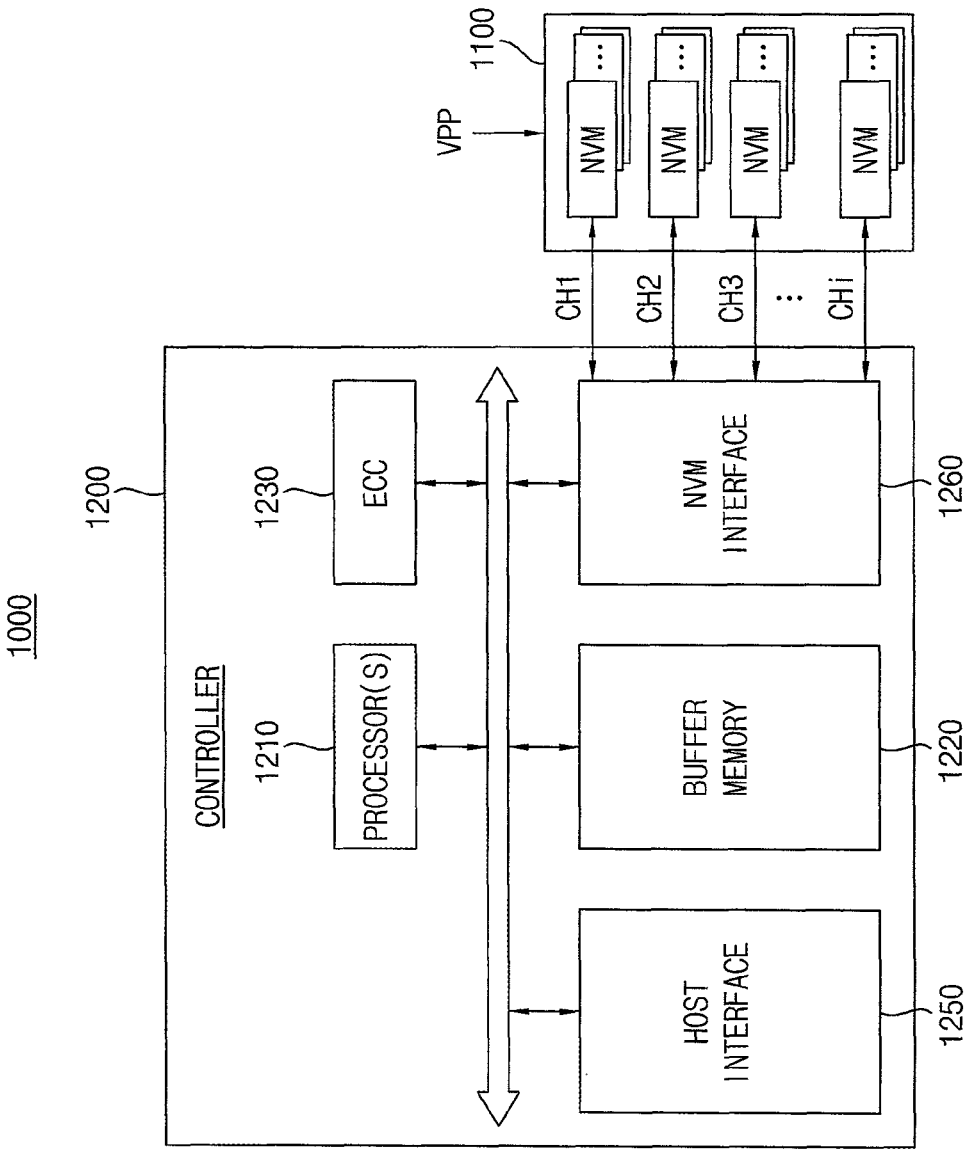
FIG. 26 is a block diagram illustrating a solid state disk or solid state drive (SSD) according to example embodiments.

FIG. 26 is a block diagram illustrating a solid state disk or solid state drive (SSD) according to example embodiments.

Referring to FIG. 26, SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the nonvolatile memory device 30 of FIG. 2. Each of the nonvolatile memory devices 1100 may reduce a time used for erase loop by determining whether a memory block is a fail block by performing a sensing operation simultaneously or sequentially on at least one string selection transistors or at least one ground selection transistors after an erase verification operation on memory cells.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, the inventive concept is not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 27:
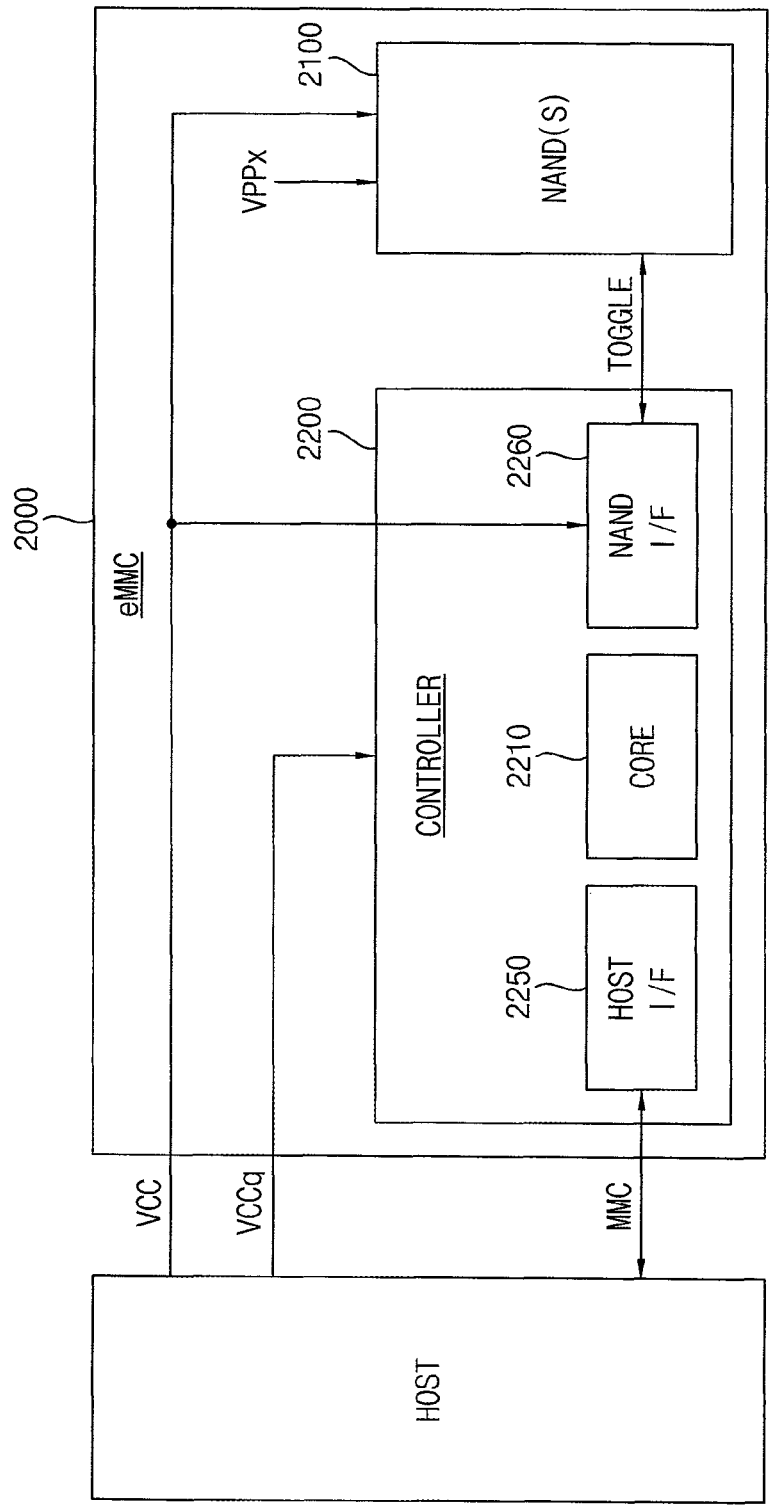
FIG. 27 is a block diagram illustrating an embedded multi-media card (eMMC) according to example embodiments.

FIG. 27 is a block diagram illustrating an embedded multi-media card (eMMC) according to example embodiments.

Referring to FIG. 27, an eMMC 2000 includes one or more NAND flash memory devices 2100 and a controller 2200.

The NAND flash memory device 2100 may include the nonvolatile memory device 30 of FIG. 2. The NAND flash memory device 2100 may reduce a time used for erase loop by determining whether a memory block is a fail block by performing a sensing operation simultaneously or sequentially on at least one string selection transistors or at least one ground selection transistors after an erase verification operation on memory cells.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host HOST. The NAND interface 2260 is configured to provide an interface between the NAND flash memory device 2100 and the controller 2200. In example embodiments, the host interface 2250 may be a parallel interface (e.g., an MMC interface). In example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

Figure 28:
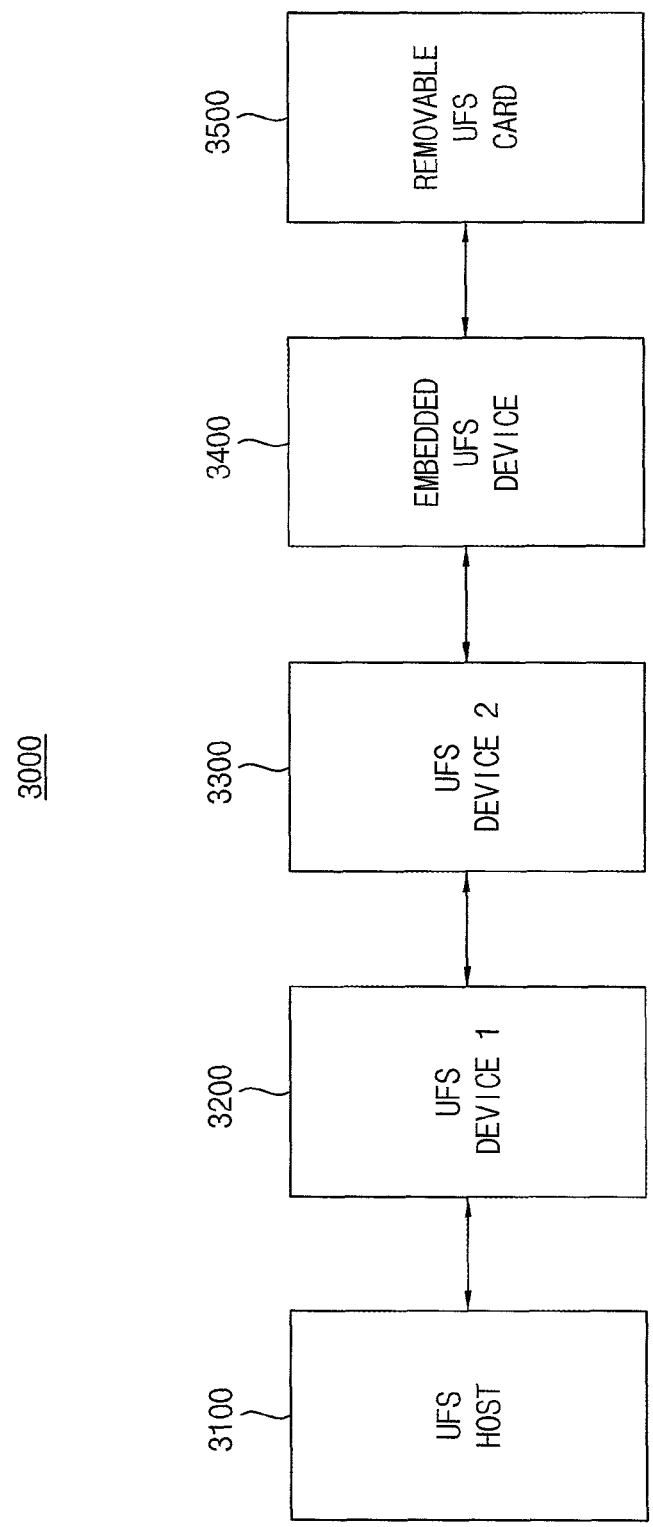
FIG. 28 is a block diagram illustrating a universal flash storage (UFS) according to example embodiments.

FIG. 28 is a block diagram illustrating a universal flash storage (UFS) according to example embodiments.

Referring to FIG. 28, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 30 of FIG. 2. Therefore, least one of the UFS devices 3200 and 3300, the embedded UFS device 3400, and the removable UFS card 3500 may reduce a time used for erase loop by determining whether a memory block is a fail block by performing a sensing operation simultaneously or sequentially on at least one string selection transistors or at least one ground selection transistors after an erase verification operation on memory cells.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 29:
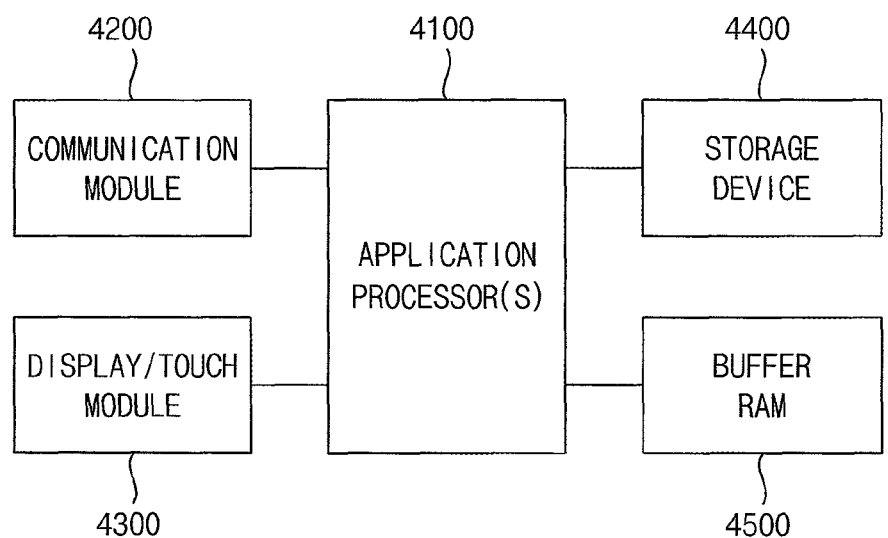
FIG. 29 is a block diagram illustrating a mobile device according to example embodiments.

FIG. 29 is a block diagram illustrating a mobile device according to example embodiments.

Referring to FIG. 29, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may include the nonvolatile memory device 30 of FIG. 2. The storage device 4400 may reduce a time used for erase loop by determining whether a memory block is a fail block by performing a sensing operation simultaneously or sequentially on at least one string selection transistors or at least one ground selection transistors after an erase verification operation on memory cells.

The mobile RAM 4500 temporarily stores data used for processing operations of the mobile device 4000.

It may be beneficial to implement a small-sized mobile device 4000 by improving the degree of freedom on lines to improve a layout.

A memory device or a storage device according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device including a plurality of memory blocks, each of the plurality of memory blocks includes a plurality of cell strings formed vertically on a substrate, the plurality of cell strings coupled to a plurality of bit-lines, the plurality of cell strings each including memory cells connected to a string selection transistor, the method comprising:
    performing an erase operation on a first memory block of the plurality of memory blocks in response to an erase command;
    performing an erase verification operation on the memory cells of the first memory block;
    performing a first sensing operation on the string selection transistors of each of the plurality of cell strings coupled to at least some bit-lines of the first memory block, the first sensing operation being based on a first sensing scheme selected among a plurality of sensing schemes; and
    determining whether the first memory block is a fail block at least based on a result of the first sensing operation.

2. The method of claim 1, wherein
    each of the plurality of cell strings includes a ground selection transistor connected to the memory cells,
    the method further includes performing selectively a second sensing operation on the ground selection transistors included in each of the plurality of cell strings coupled to the at least some bit-lines of the first memory block based on the result of the first sensing operation,
    the second sensing operation is based on a second sensing scheme selected from the plurality of sensing schemes, and the determining whether the first memory block is the fail block includes determining whether the first memory block is the fail block based on a result of the second sensing operation.

3. The method of claim 2, wherein
the performing the first sensing scheme includes selecting the first sensing scheme based on characteristics of at least one of the string selection transistors included in the plurality of cell strings coupled to the at least some bit lines of the first memory block, and
the first sensing operation is simultaneously performed on the string selection transistors included in the plurality of cell strings coupled to the at least some bit lines of the first memory block using at least one sensing voltage.

4. The method of claim 3, wherein
the performing the first sensing operation includes applying simultaneously a first sensing voltage to the string selection transistors included in each of the plurality of cell strings of the first memory block, and applying simultaneously a second sensing voltage different from the first sensing voltage to the string selection transistors included in each of the plurality of cell strings of the first memory block, and
a level of the first sensing voltage is lower than a target level of the string selection transistors included in each of the plurality of cell strings of the first memory block, and
the second sensing voltage corresponds to the target level.

5. The method of claim 4, wherein string selection transistors, which are determined as an off-state by the first sensing voltage, are sensed by the second sensing voltage.

6. The method of claim 3, wherein
the second sensing scheme is selected based on characteristics of at least one of the ground selection transistors included in the plurality of cell strings of the first memory block,
the second sensing operation is simultaneously performed on the ground selection transistors included in at least two of the plurality of cell strings of the first memory block using at least one sensing voltage,
the second sensing operation includes applying simultaneously a first sensing voltage to the ground selection transistors included in at least two of the plurality of cell strings of the first memory block; and applying simultaneously a second sensing voltage different from the first sensing voltage to the ground selection transistors included in at least two of the plurality of cell strings of the first memory block, and
the second sensing operation is selectively performed when the string selection transistors included in the plurality of cell strings coupled to the at least some bit lines are determined as an off-state by the first sensing operation.

7. The method of claim 3, wherein
the performing the first sensing operation includes applying simultaneously a first sensing voltage having a target level to the string selection transistors in at least two of the plurality of cell strings of the first memory block, and
the performing selectively the second sensing operation includes selecting the second sensing scheme based on characteristics of at least one of the ground selection transistors included in the plurality of cell strings of the first memory block, and
the performing selectively the second sensing operation includes simultaneously performing the second sensing operation on the ground selection transistors in at least two of the plurality of cell strings of the first memory block using at least one sensing voltage.

8. The method of claim 3, wherein the performing the first sensing operation includes performing the first sensing operation on all the plurality of cell strings coupled to all of the plurality of bit-lines of the first memory block.

9. The method of claim 3, wherein performing the first sensing operation includes performing the first sensing operation on a portion of the plurality of cell strings coupled to a portion of the plurality of bit-lines of the first memory block and precharging the portion of the plurality of bit-lines.

10. The method of claim 3, further comprising:
performing selectively a cell sensing operation using at least one cell sensing voltage on the memory cells of each of the plurality of cell strings on word-line basis based on the result of the second sensing operation,
wherein the determining whether the first memory block is the fail block further includes determining whether the first memory blocks is the fail block based on a result of the cell sensing operation.

11. The method of claim 2, wherein the performing the first sensing operation includes selecting the first sensing scheme is selected based on characteristics of at least one of the string selection transistors in the first memory block, and
the first sensing operation is sequentially performed on the string selection transistors of each of the cell strings coupled to at least some bit-lines of the first memory block using at least one sensing voltage.

12. The method of claim 11, wherein
the second sensing scheme is selected based on characteristics of at least one of the ground selection transistors of the first memory block,
the second sensing operation is sequentially performed on the ground selection transistors included in each of the cell string coupled to the at least some bit-lines of the first memory block using at least one sensing voltage, and
the determining whether the first memory block is the fail block is determined based on the result of the second sensing operation.

13. The method of claim 2, wherein
the first sensing scheme is selected based on characteristics of at least one of the string selection transistors included in the cell strings of the first memory block,
the first sensing operation is simultaneously performed on the string selection transistors of each of the plurality of cell strings coupled to the at least some bit-lines of the first memory block using at least one sensing voltage,
the second sensing scheme is selected based on characteristics of at least one of the ground selection transistors of the first memory block, and
the second sensing operation is sequentially performed on the ground selection transistors of each of the plurality of cell strings coupled to the at least some bit-lines of the first memory block using at least one sensing voltage.

14. A nonvolatile memory device, comprising:
a memory cell array including a plurality of memory blocks, each of the plurality of memory blocks including a plurality of cell strings formed vertically on a substrate, the plurality of cell strings coupled to a plurality of bit-lines, the plurality of cell strings each including memory cells connected to a string selection transistor and ground selection transistor;

a voltage generator configured to generate word-line voltages in response to control signals;
an address decoder configured to apply the word-line voltages to the memory cell array in response an address signal;
a page buffer circuit coupled to the memory cell array through the plurality of bit-lines; and
a control circuit, wherein
the control circuit is configured to control the voltage generator and the page buffer circuit,
the control circuit is configured to perform an erase operation and an erase verification operation on a first memory block of the memory blocks in response to an erase command, and
the control circuit is configured control the voltage generator and the page buffer circuit such that the voltage generator and the page buffer circuit perform a first sensing operation on the string selection transistor of each of the plurality of cell strings coupled to at least some bit-lines of the first memory block,
the first sensing operation is based on a first sensing scheme selected among a plurality of sensing schemes,
the control circuit is configured perform selectively a second sensing operation on the ground selection transistor of each of the plurality of cell strings coupled to at least some bit-lines of the first memory block based on a result of the first sensing operation, and
the second sensing operation being based on a second sensing scheme selected among the plurality of sensing schemes.

15. The nonvolatile memory device of claim 14, wherein
the control circuit is configured to select the first sensing scheme based on characteristics of the string selection transistor of at least one of the plurality of cell strings,
the control circuit is configured to control the first sensing operation such that the first sensing operation is simultaneously performed on the string selection transistors of at least one of the plurality of cell strings using at least one sensing voltage,
the control circuit is configured to select the second sensing scheme based on characteristics of the ground selection transistor of at least some of the plurality of cell strings, and
the control circuit is configured to control the second sensing operation so the second sensing operation is simultaneously performed on the ground selection transistor of at least one of the plurality of cell strings using the at least one sensing voltage.

16. A method of operating a nonvolatile memory device including a plurality of memory blocks on a substrate, each of the memory blocks including a plurality of cell strings coupled to a plurality of bit lines, each of the plurality of cell strings including a plurality of memory cells connected to each other between a string selection transistor and a ground selection transistor on the substrate, the method comprising:
performing an erase operation on a first memory block of the plurality of memory blocks;
performing an erase verification operation on the first memory block;
performing a first sensing operation on the string selection transistors of at least two cell strings of among the plurality of cell strings of the first memory block,
the first sensing operation including determining whether at least one of the string selection transistors of the at least two cell strings of the first memory block are in an off state or an on state using a first sensing scheme selected among a plurality of sensing schemes; and
determining whether the first memory block is a fail block using a result of the first sensing operation.

17. The method of claim 16, wherein the determining whether the first memory block is a fail block includes determining the first memory block is a fail block in response to the result of the first sensing operation corresponding to at least one of the string selection transistors of the at least two cell strings of the first memory block being in the on state.

18. The method of claim 16, wherein
the performing the first sensing operation includes:
pre-charging the bit lines connected to the first memory block,
applying a first sensing voltage simultaneously to the string selection transistors of the at least two cell strings of the first memory block after the plurality of bit lines are pre-charged,
applying a second sensing voltage simultaneously to the string selection transistors of the at least two cell strings of the first memory block after the plurality of bit lines are pre-charged, and
determining the first memory block is a fail block in response to a voltage level of a sensing node connected to one of the plurality of bit lines connected to the at least two cell strings of the first memory block changes in response to either one of the applying the first sensing voltage simultaneously to the string selection transistors of the at least two cell strings of the- first memory block or the applying the second sensing voltage simultaneously to the string selection transistors of the at least two cell strings of the first memory block, and
the first sensing voltage is lower than the second sensing voltage,
the second sensing voltage corresponds to a target level of the string selection transistors in the cell strings of the first memory block.

19. The method of claim 16, further comprising:
performing a second sensing operation on the ground selection transistors of at least two cell strings of the first memory block in response to the result of the first sensing operation corresponds to the string selection transistors of the at least two cell strings of the first memory block being in the off state, wherein
the second sensing operation includes determining whether at least one of the ground selection transistors of the at least two cell strings of the first memory block are in the off state or the on state using a second sensing scheme selected among a plurality of sensing schemes, and
the determining whether the first memory block is a fail block includes using a result of the second sensing operation.

20. The method of claim 16, wherein the performing the first sensing operation includes selecting the first sensing scheme based on the characteristics of at least one of the string selection transistors of the at least two cell strings of the first memory block.

* * * * *